(12) United States Patent
Tsuji et al.

(10) Patent No.: US 6,597,621 B2
(45) Date of Patent: Jul. 22, 2003

(54) MULTI-BANK SEMICONDUCTOR MEMORY DEVICE

(75) Inventors: Takaharu Tsuji, Hyogo (JP); Akinori Shibayama, Kyoto (JP)

(73) Assignees: Mitsubishi Denki Kabushiki Kaisha, Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/791,778

(22) Filed: Feb. 26, 2001

(65) Prior Publication Data

US 2002/0031035 A1 Mar. 14, 2002

(30) Foreign Application Priority Data

Sep. 8, 2000 (JP) .......................... 2000-273629

(51) Int. Cl.[7] .............. G11C 7/00; G11C 8/00
(52) U.S. Cl. ............. 365/230.03; 365/230.06; 365/189.09
(58) Field of Search ............ 365/230.03, 230.06, 365/189.09

(56) References Cited

U.S. PATENT DOCUMENTS

| | | | | |
|---|---|---|---|---|
| 5,050,930 A | * | 9/1991 | Schuster et al. ....... | 365/203.03 |
| 5,777,942 A | * | 7/1998 | Dosaka et al. ......... | 365/230.03 |
| 5,831,924 A | * | 11/1998 | Nitta et al. ............ | 365/230.03 |
| 5,953,280 A | | 9/1999 | Matsui .................. | 365/230.03 |
| 6,064,621 A | * | 5/2000 | Tanizaki et al. ....... | 365/230.03 |
| 6,078,542 A | * | 6/2000 | Tomishima ............ | 365/230.03 |
| 6,091,659 A | * | 7/2000 | Watanabe et al. ...... | 365/230.03 |
| 6,134,178 A | * | 10/2000 | Yamazaki et al. ..... | 365/230.03 |
| 6,310,815 B1 | * | 10/2001 | Yamagata et al. ..... | 365/230.03 |
| 6,314,042 B1 | * | 11/2001 | Tomishima et al. .... | 365/230.03 |

FOREIGN PATENT DOCUMENTS

| | | |
|---|---|---|
| JP | 10-334663 | 12/1998 |
| JP | 11-68063 | 3/1999 |
| JP | 11-195766 | 7/1999 |

* cited by examiner

Primary Examiner—Trong Phan
(74) Attorney, Agent, or Firm—McDermott, Will & Emery

(57) ABSTRACT

In a semiconductor memory device with a plurality of banks having a plurality of memory sub array, according to a mode setting signal, data access control is made depending on whether access is made on a memory sub array basis or a bank basis. A multi-bank semiconductor memory device is provided capable of easily implementing both of a low power consumption mode and a long page size mode.

7 Claims, 17 Drawing Sheets

$(i = 0 \sim \frac{N-2}{2})$

MULTI-BANK SEMICONDUCTOR MEMORY DEVICE

BACKGROUND OF THE INVENTION

1. Field of the Invention

The present invention relates to semiconductor memory devices and particularly to a multi-bank semiconductor memory device having a plurality of banks. More specifically, the invention relates to a multi-bank DRAM (Dynamic Random Access Memory).

2. Description of the Background Art

In a semiconductor memory device such as a DRAM (Dynamic Random Access Memory), a plurality of banks are provided for improving data access efficiency.

FIG. 25 is a schematic diagram showing an entire structure of a conventional multi-bank DRAM Referring to FIG. 25, DRAM 900 includes banks BK#A and BK#B. Bank BK#A includes a memory array 902a having memory cells (not shown) arranged in rows and columns and word lines WL (0)–WL (m) arranged corresponding to respective memory cell rows, a row decoder 903a generating a row decode signal for designating a row in memory array 902a, and a word line driver for driving, into the selected state, a word line arranged corresponding to an addressed row according to the row decode signal from row decoder 903a. Memory array 902a includes a global data bus GDB provided in a direction intersecting word lines WL (0)–WL (m). Global data bus GDB is coupled to an input/output buffer 906a.

Bank BK#B similarly includes a memory array 902b having memory cells (not shown) arranged in rows and columns and word lines WL (0)–WL (m) provided corresponding to respective memory cell rows, a row decoder 903b for decoding a row address signal to generate a row decode signal for specifying an addressed row, and a word line driver 904b for driving, into the selected state, a word line arranged corresponding to an addressed row in memory array 902b according to the row decode signal from row decoder 903b. Memory array 902b also includes a global data bus GDB provided in the direction intersecting word lines WL (0)–WL (m). Global data bus GDB of memory array 902b is coupled to an input/output buffer 906b.

Input/output buffers 906a and 906b are both coupled to N-bit IO lines IO (0)–IO (N−1) to input/output N-bit data. Respective IO lines coupled to input/output buffers 906a and 906b are interconnected by internal data transmission lines IL (0)–IL (N−1). These internal data transmission lines IL (0)–IL (N−1) are coupled to a load circuit 907 to be precharged to a predetermined voltage level.

Input/output buffers 906a and 906b are also coupled to a group of N-bit data input/output terminals 910.

A control circuit 905 is commonly provided to banks BK#A and BK#B. Control circuit 905 controls operations of banks BK#A and BK#B in accordance with an address signal (multi-bit address) ADD supplied to an address terminal 908 and a command CMD supplied to a command input terminal 909. Specifically, when a bank address included in address signal ADD designates bank BK#A, for example, control circuit 905 generates a control signal necessary for an operation designated by command CMD to supply the generated signal to bank BK#A. For example, if command CMD designates array activation (word line selection) and a bank address included in address signal ADD designates bank BK#A, control circuit 905 activates row decoder 903a and word line driver 904a provided for bank BK#A. Accordingly, in memory array 902a, a word line corresponding to a row designated by address signal ADD is driven into the selected state.

If data access (data writing or reading) for bank BK#A is designated by address signal ADD and command CMD, control circuit 905 generates a control signal for activating input/output buffer 906a of bank BK#A to allow data to be transferred (written/read) between corresponding data bus GDB and data input/output terminal group 910.

In the DRAM shown in FIG. 25, banks BK#A and BK#B are provided with respective row decoders for row selection and respective word drivers as well as respective input/output buffers for data input/output. If a row selecting circuit, a column selecting circuit (not shown) and the data input/output circuit are provided for each bank as is done in DRAM 900, a possible problem is that increase in number of banks results in increase in chip area or area penalty of DRAM 900.

In order to overcome such a problem of increase in chip area due to the structure having the row selection, column selection and data input/output circuits provided for each bank, a bank structure shown in FIG. 26 is employed in an embedded DRAM for example formed on the same semiconductor chip as that of logic.

FIG. 26 is a schematic diagram showing an entire structure of a conventional embedded DRAM. In FIG. 26, embedded DRAM 950 includes banks BK#0 and BK#1. Bank BK#0 includes memory sub arrays 952a and 952b aligned in a row direction and a row selection circuit 954a for selecting rows in respective memory sub arrays 952a and 952b. Row selection circuit 954a includes a row decoder and a word line driver.

Bank BK#1 includes memory sub arrays 952c and 952d aligned in the row direction, and a row selection circuit 954b provided between memory sub arrays 952c and 952d for selecting rows in respective memory sub arrays 952c and 952d. Row selection circuit 954b also includes a row decoder and a word line driver. Memory sub arrays 952a–952d each include (m/2)+1 word lines WL (0)–WL (m/2).

A global data bus GDB is commonly provided to memory sub arrays aligned in the column direction. Specifically, a global data bus GDB coupled to an input/output buffer 956a is commonly provided to memory sub arrays 952a and 952c and a global data bus GDB coupled to an input/output buffer 956b is commonly provided to memory sub arrays 952b and 952d. These global data buses GDBs each have a bit width of N/2.

Input output buffer 956a is coupled to a group of data input/output nodes 960a with a bit width of N/2 through internal data lines IO<0> to IO<N/2−1> and input/output buffer 956b is coupled to a group of data input/output nodes 960b with a bit width of N/2 through internal data lines IO<N/2> to IO<N−1>.

A control circuit 958 is provided commonly to banks BK#0 and BK#1 for controlling operations of these banks BK#0 and BK#1. Control circuit 958 receives an address signal ADD supplied to an address input node 962 and a command CMD supplied to a command input node 964 to generate a control signal necessary for an operation designated by this command signal CMD.

In the structure of the embedded DRAM shown in FIG. 26, input/output buffers 956a and 956b are shared by banks BK#0 and BK#1 Global data bus GDB is also shared by banks BK#0 and BK#1 Global data bus GDB has a bit width of N/2. Arrangement of banks BK#0 and BK#1 aligned in the column direction makes it possible to arrange the input/output buffers and global data buses commonly to these banks to reduce the chip area of the embedded DRAM.

In the bank structure as shown in FIG. 26, a word line must be selected in each of the two memory sub arrays aligned in the row direction. Compared with the bank structure shown in FIG. 25, the equivalent total length of a word line is made longer and a greater number of sense amplifiers are simultaneously activated. Resultant problems are increase in current consumption in row selection and increase in load of a boosted voltage source circuit generating a boosted voltage used for a word line drive signal transmitted to a selected word line.

It would be possible to reduce the power consumption of the embedded DRAM as shown in FIG. 26 by activating only one memory sub array in a selected bank.

Specifically, as shown in FIG. 27, input/output buffers 956a and 956b are coupled commonly to a group of data input/output nodes 966 through the internal data bus lines IO<N−1;0>. One of memory sub arrays 952a and 952b or one of memory sub arrays 952c and 952c is specified by address signal bits. According to such a structure, only one memory sub array is activated in a selected bank so that current consumption in row selection can be reduced, compared with the current consumed in the bank structure shown in FIG. 26.

However, in the structure of embedded DRAM 950 oriented to reduction of current consumption as shown in FIG. 27, if the number of data input/output bits is the same N-bit, n-bit memory cells must be selected in one memory sub array and accordingly global data bus GDB must have the bit width of N bits. If the memory sub arrays have the same number of columns, the page length of columns in one memory sub array (the number of column addresses included in one page) decreases by half.

Therefore, the embedded DRAMs shown in FIGS. 26 and 27 need individual optimal designs according to respective specifications, and there is thus no compatibility between the embedded DRAMs shown in FIGS. 26 and 27.

A problem of low design efficiency then arises due to the need of optimal design of a DRAM according to its specification as well as design change for each DRAM according to specification change.

SUMMARY OF THE INVENTION

An object of the present invention is to provide a semiconductor memory device that flexibly accommodates a change in specification.

Another object of the invention is to provide a DRAM that can be adapted for any of different page sizes.

A semiconductor memory device according to the invention includes a plurality of banks each divided into a plurality of memory blocks and activated independently of each other, and a control circuit provided commonly to these banks for controlling access to the banks. According to a mode instruction signal, the control circuit allows access to the banks on the basis of a memory block in a first mode and allows access on the basis of a bank in a second mode.

The mode instruction signal is used for changing the manner in which the bank is accessed, i.e., whether the access is made on the basis of a memory block or a bank. In a low power consumption mode, access is made on the basis of a memory block. In order to increase the page size, access is made on the basis of a bank. In this way, the internal bank structure can easily be changed according to application of the semiconductor memory device. In addition, only the mode instruction signal is used for changing the operation manner and changing the manner in which internal data lines are connected. The semiconductor memory device can thus easily operate in a plurality of operation modes with the same chip layout.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
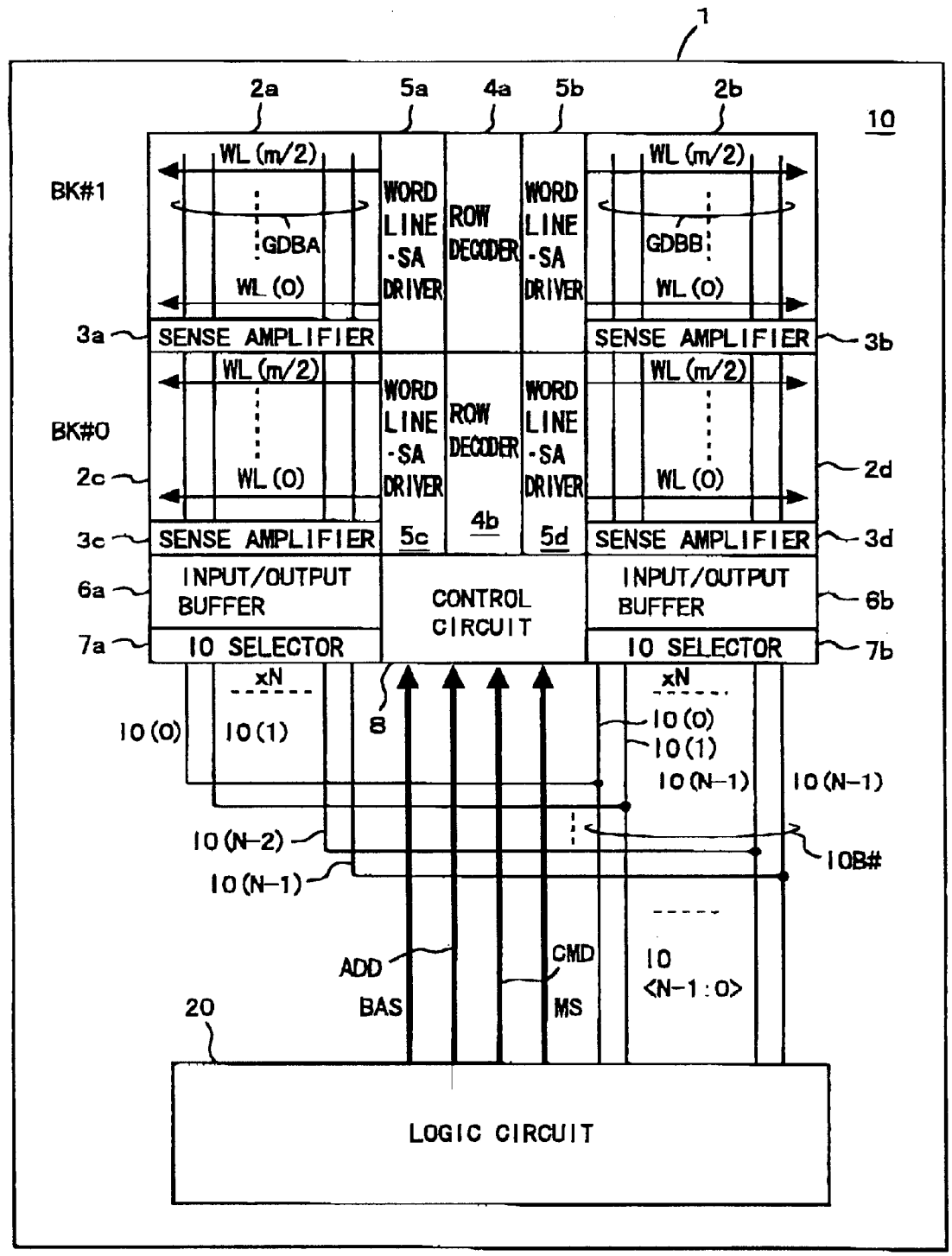
FIG. 1 is a schematic diagram showing data line connection in a first operation mode of a semiconductor memory device according to the present invention.

FIG. 1 is a schematic diagram showing an entire structure of a semiconductor integrated circuit device according to a first embodiment of the present invention. Referring to FIG. 1, a semiconductor integrated circuit device 1 includes a DRAM macro 10 and a logic circuit 20 accessing DRAM macro 10 to write or read necessary data. DRAM macro 10 and logic circuit 20 are integrated on the same semiconductor chip logic circuit 20 carries out predetermined processing and accesses the DRAM macro for providing/receiving necessary data. DRAM macro 10 and logic circuit 20 are coupled by an IO data bus IOB# of N-bit width, IO data bus IOB# has bus lines IO (0)–IO (N–1), i.e., IO <N–1:0>.

DRAM macro 10 includes memory sub arrays 2a–2d each having a plurality of memory cells (DRAM cells) arranged in rows and columns. Memory sub arrays 2a and 2b are aligned in the row direction to constitute a bank BK#1 and memory sub arrays 2c and 2d are aligned in the row direction to constitute a bank BK#0. Memory sub arrays 2a and 2c are aligned in the column direction, and memory sub arrays 2b and 2d are aligned in the column direction.

For memory sub arrays 2a–2d, sense amplifiers 3a–3d are respectively provided corresponding thereto to sense, amplify and latch memory cell data on selected columns in corresponding memory sub arrays. If memory sub arrays 2a–2d each have a block divided structure to be divided into blocks, sense amplifiers 3a–3d are each arranged corresponding to memory blocks of a corresponding memory sub array. Memory sub arrays 2a–2d each include word lines WL (0)–WL (m/2) arranged corresponding to respective memory cell rows.

A row decoder 4a for decoding a row address signal is provided between memory sub arrays 2a and 2b, and a row decoder 4b for decoding a row address signal is provided between memory sub arrays 2c and 2d A word line•SA (sense amplifier) driver 5a is arranged between memory sub array 2a, and row decoder 4a and a word line•SA (sense amplifier) driver 5b is arranged between row decoder 4a and memory sub array. Each of word line•SA drivers 5a and 5b includes a word line driver according to a row decode signal from row decoder 4a to drive an addressed word line in a corresponding memory sub array into the selected state, and a sense amplifier drive circuit (driver) according to a sense amplifier activation signal to activate a corresponding sense amplifier.

Similarly, a row decoder 4b and word line•SA drivers 5c and 5d are provided for memory sub arrays 2c and 2d.

A global data bus GDBA extending in the column direction is commonly provided for memory sub arrays 2a and 2c and a global data bus GDBB is commonly provided for memory sub arrays 2b and 2d. These global data buses GDBA and GDBB are coupled to input/output buffers 6a and 6b, respectively. For respective input/output buffers 6a and 6b, IO selectors 7a and 7b are provided for changing a manner of connection between the global data buses and IO data bus IOB# depending on an operation mode. Further, a control circuit 8 is commonly provided for banks BK#1 and BK#0 Control circuit 8, according to a mode setting signal MS, a command CMD, an address signal ADD and a bank designation signal BAS, activates a designated bank and generate a control signal necessary for an operation designated by command CMD.

In the arrangement shown in FIG. 1, IO selectors 7a and 7b are commonly coupled to IO data bus IOB#. IO selectors 7a and 7b each have the N-bit width and couple an N-bit input/output circuits of a corresponding input/output buffer 6a or 6b to bus lines IO <N–1:0> of N-bit IO bus IOB#.

In the structure shown in FIG. 1, only one of input/output buffers 6a and 6b having the N-bit width is activated for data access (read/write). In other words, activation/inactivation is performed for each memory sub array in banks BK#1 and BK#0.

N-bit data access is made to a selected memory sub array. N-bit memory cells should accordingly be selected in each of memory sub arrays 2a–2d. If memory sub arrays 2a–2d have M memory cell columns, the number of columns included in one page is M/N. When a memory sub array is to be accessed, a block selection signal (address) specifying a memory sub array is used to specify the memory sub array in a selected bank. The block selection signal for specifying a memory sub array is included in address signal ADD.

Consumed current in this case can thus be reduced since one memory sub array is selected in a selected bank. However, the page size is smaller.

Mode setting signal MS designates a low power consumption mode. Although this mode setting signal MS is generated from logic circuit 20, it may fixedly be set by a bonding pad, for example, according to usage. Alternatively, logic circuit 20 may dynamically generate mode setting signal MS according to the status of progress in its processing, as described later.

Figure 2:
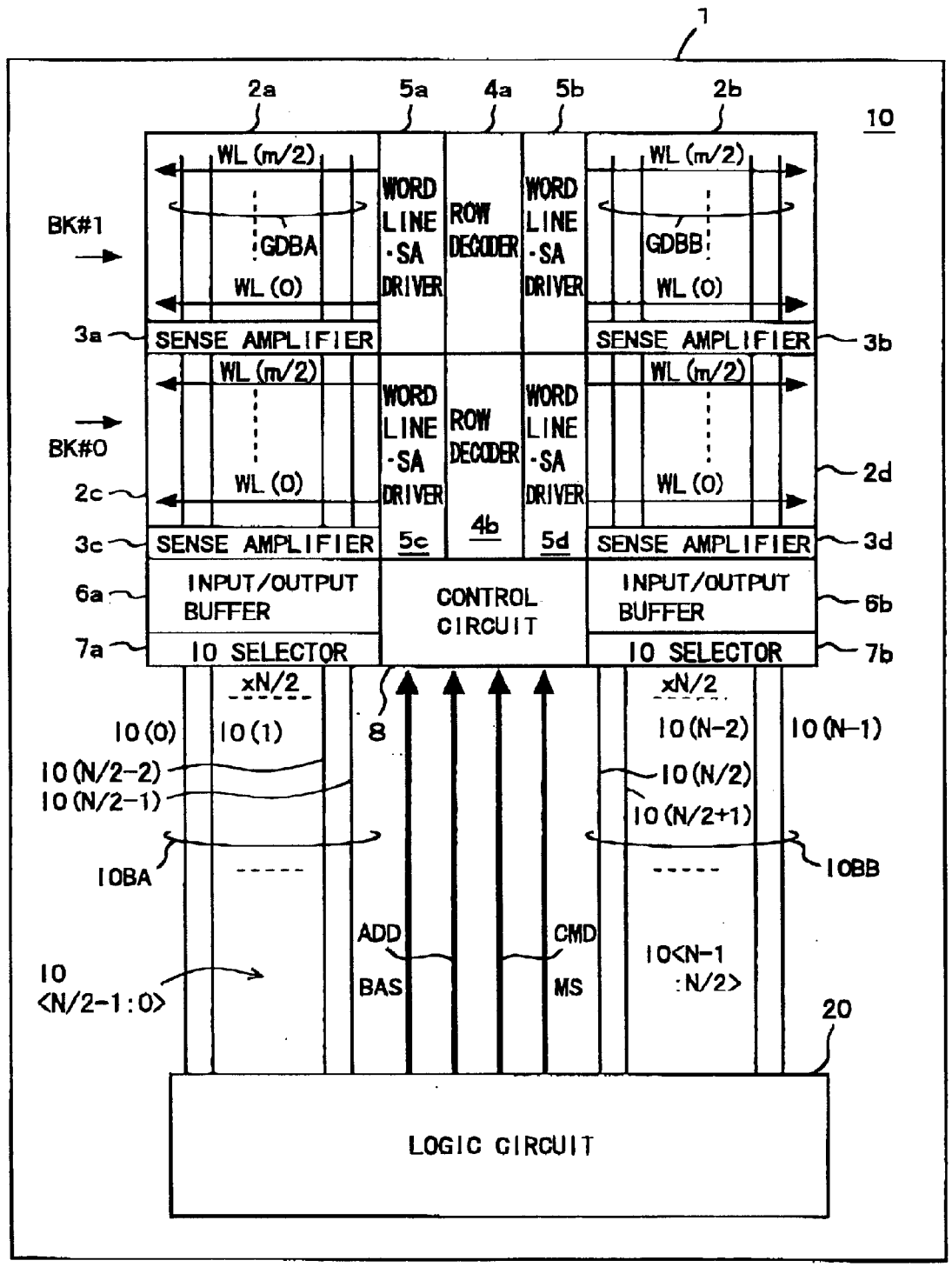
FIG. 2 is a schematic diagram showing data line connection in a second operation mode of the semiconductor memory device according to the invention.

FIG. 2 shows arrangement of buses in a normal page mode of the semiconductor integrated circuit device according to the present invention. In the structure shown in FIG. 2, IO selector 7a is coupled to logic circuit 20 via a N/2-bit IO data bus IOBA and IO selector 7b is coupled to logic circuit 20 via a N/2-bit IO data bus IOBB. These IO data buses IOBA and IOBB transfer data bits in parallel. N-bit data is thus transferred between logic circuit 20 and DRAM macro 10 as done in the structure shown in FIG. 1.

In this case, data access is made in parallel to two memory sub arrays of one of banks BK#0 and BK#1. The page size can accordingly be increased (twice that of the structure in FIG. 1) to accomplish high-speed access with reduced overhead in page switching.

As shown in FIGS. 1 and 2, DRAM macro 10 has its structural arrangement unchanged, and bus connection is changed by IO selectors 7a and 7b. The memory sub array specification signal and mode setting signal are merely used to be able to implement both the operation mode shown in FIG. 1 (hereinafter referred to as half page mode) and that shown in FIG. 2 (hereinafter referred to as normal page mode) by the same DRAM macro. If semiconductor integrated circuit device 1 (system LSI) is applied to a specific use and thus connection between logic circuit 20 and DRAM macro 10 is uniquely defined, connection of IO data buses IOB is fixedly determined. Mask interconnection may just be utilized for determining the IO data bus connection depending on type (use) to readily implement a system LSI that meets a required specification. Structures of respective components are described now.

Figure 3:
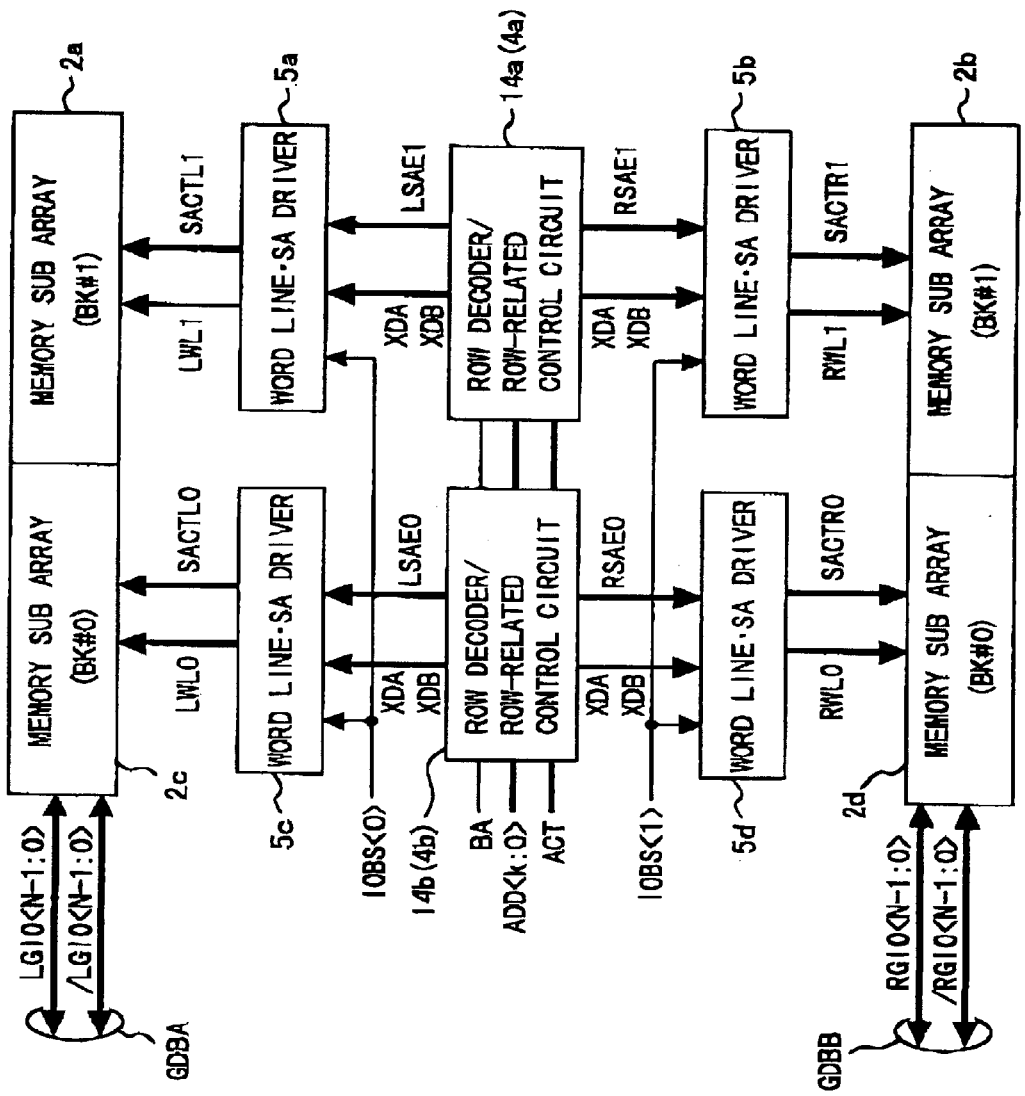
FIG. 3 is a schematic diagram showing a structure of a main part of the semiconductor memory device according to the invention.

FIG. 3 more specifically shows a structure of a row-related control circuit shown in FIGS. 1 and 2. Referring to FIG. 3, a row decoder/row-related control circuit 14a is provided for bank BK#1 and a row decoder/row-related control circuit 14b is provided for bank BK#0. Row decoder/row-related control circuits 14a and 14b correspond respectively to row decoders 4a and 4b shown in FIGS. 1 and 2. Row decoder/row-related control circuits 14a and 14b each generate control signals necessary for row selection according to bank designation signal (bank address) BA, row address signal ADD <k:0> and array activation signal ACT from control circuit 8 shown in FIGS. 1 and 2. Row decoder/row-related control circuits 14a and 14b in FIG. 3 decode (predecode) row address signal ADD <k:0> to generate and output row decode (predecode) signals XDA and XDB and also activate sense amplifier activation signals LSAE and RSAE according to array activation signal ACT when selected. Row decoder/row-related control circuits 14a and 14b are selectively enabled according to bank designation signal BA. Array activation signal ACT is activated by control circuit 8 when the logic supplies a command (active command) instructing to select a row.

Row decode (predecode) signals XDA and XDB and sense amplifier activation signal SAE (LSAE1, RSAE1) output from row decoder/row-related control circuit 14a are supplied to word line•SA drivers 5a and 5b. Row decode (predecode) signals XDA and XDB and sense amplifier activation signal SAE (LSAE0, RSAE0) output from row decoder/row-related control circuit 14b are supplied to word line•SA drivers 5c and 5d. Further, a block selection signal IOBS <0> for activating a memory sub array is supplied to word line•SA drivers 5a and 5c, and a block selection signal IOBS <1> for designating a memory sub array is supplied to word line•SA drivers 5b and 5d.

Word line•SA drivers 5a and 5c include a word line driver according to row decode (predecode) signals XDA and XDB and block selection signal IOBS <0> to generate a word line drive signal LWL (LWL1, LWL0), and a sense amplifier driver (control circuit) according to sense amplifier activation signal LSAE (LSAE1, LSAE0) and block selection signal IOBS <0> to generate a sense amplifier circuit control signal SACTL.

According to word line drive signals LWL1 and LWL0, word lines corresponding to addressed rows in memory sub arrays 2a and 2c are driven into the selected state. Sense amplifier 3 (3a, 3c) is activated according to sense amplifier circuit control signal SACTL (SACTL1, SACTL0). Sense amplifiers are provided corresponding to respective columns of a corresponding memory sub array and each include an N sense amplifier having cross-coupled N channel MOS transistors and a P sense amplifier constituted of cross-coupled P channel MOS transistors. Sense amplifier circuit control signal SACTL includes a signal SON for activating N sense amplifiers and a signal SOP for activating P sense amplifiers.

Word line•SA drivers 5b and 5d each receive row decode (predecode) signals XDA and XDB and sense amplifier activation signal RSAE (RSAE1, RSAE0) from corresponding row decoder/row-related control circuits 14a or 14b as well as block selection signal IOBS <1> Word line•SA drivers 5b and 5d also include a word line driver generating word line drive signal RWL according to row decode (predecode) signals XDA and XDB and a sense amplifier driver (control circuit) generating sense amplifier circuit control signal SACTR (SACTR1, SACTR0) according to sense amplifier activation signal RSAE.

Block selection signals IOBS >0> and IOBS <1> designate corresponding memory sub arrays when activated. The generation method of block selection signals IOBS <0> and IOBS <1> will be detailed later, but in brief, the block selection signals are generated according to an address signal and a mode setting signal. For access to a memory sub array, block selection signals IOBS <0> and IOBS <1> are generated according to address signal bit ADD <k+1> designating a memory sub array. In the normal page mode, block selection signals IOBS <0> and IOBS <1> are both driven into the selected state to enable an access to each bank.

Global data bus GDBA is provided for memory sub arrays 2a and 2c and global data bus GDBB is provided for memory sub arrays 2b and 2d. Global data bus GDBA includes a group of N-bit global data lines LGIO <N−1:0> and a group of complementary global data lines /LGIO <N−1:0>. Global data bus GDBB includes a group of N-bit global data lines RGIO <N−1:0> and a group of complementary global data lines /RGIO <N−1:0>. In both of the normal page mode and the half page mode, N-bit data is transmitted through global data bus GDBA and/or GDBB.

Figure 4:
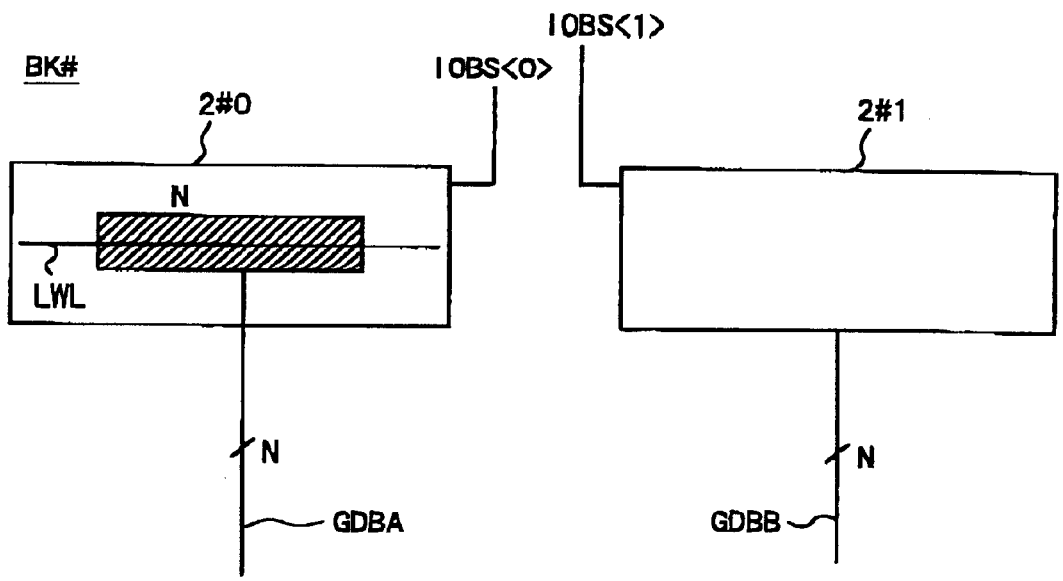
FIG. 4 schematically shows a state of a selected memory cell in the first operation mode of the semiconductor memory device according to the invention.

FIG. 4 schematically shows a selected memory cell in the half page mode. Two memory sub arrays 2#0 and 2#1 of a bank BK# (BK#0 or BK#1) are shown in FIG. 4 It is supposed here that block selection signal IOBS <0> is in a selected state. Block selection signal IOBS <1> is now in the non-selected state. In the half page mode, access is made on the basis of a memory sub array. In this state, word line LWL is selected in memory sub array 2#0 and N-bit memory cells on the selected word line LWL are coupled in parallel to global data bus GDBA via a column selection circuit (not shown). Row selection or data access is not performed in memory sub array 2#1. Data access to the selected N-bit memory cells is carried out via global data bus GDBA.

Figure 5:
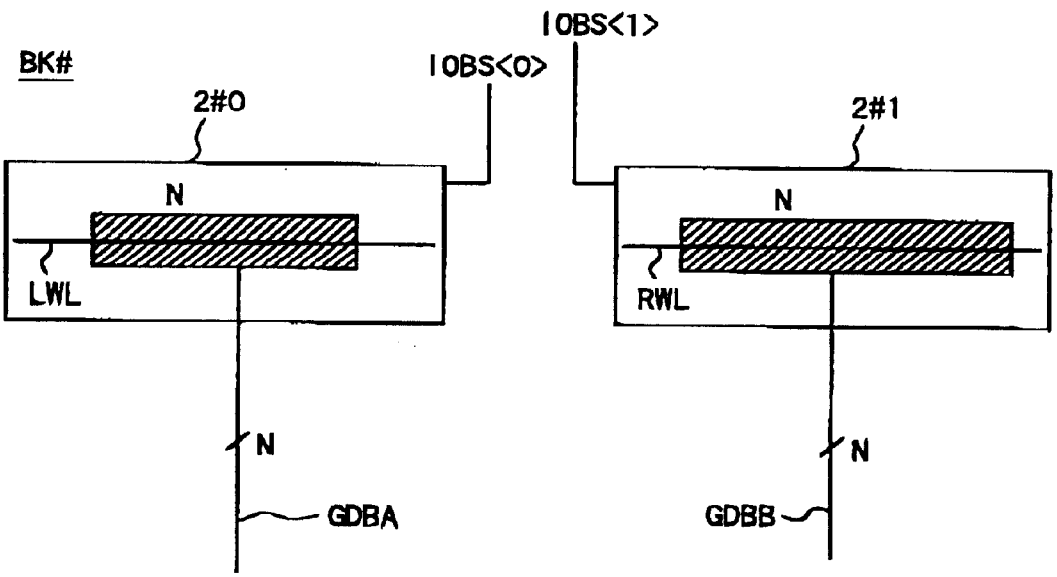
FIG. 5 schematically shows a state of a selected memory cell in the second operation mode of the semiconductor memory device according to the invention.

FIG. 5 schematically shows a state of selected memory cells in the normal page mode. As shown in FIG. 5, in the normal page mode, both of block selection signals IOBS <0> and IOBS <1> are driven into the selected state. Accordingly, word lines LWL and RWL are both driven into the selected state according to a row address signal in memory sub arrays 2#0 and 2#1. Then N-bit memory cells are selected in each of memory sub arrays 2#0 and 2#1 to be coupled to each of global data buses GDBA and GDBB. 2·N-bit data is thus internally transferred. If an external data bit width is N-bit, the IO selector is used to select N-bit data from 2·N-bit data.

In the half page mode, a word line is selected in one memory sub array, and thus the page size is reduced by half, as compared with that in the normal page mode shown in FIG. 5 in which word lines are selected in two memory sub arrays. However, the number of memory cells connected to a selected word line in the half page mode is a half of the number of memory cells connected to selected word lines in the normal page mode, which provides reduction in power consumption.

It is noted that bank BK# is designated by bank designation signal BA and a row decoder/row-related control circuit corresponding to the bank designated by bank designation signal BA is activated.

Structure of Row Decoder

Figure 6:
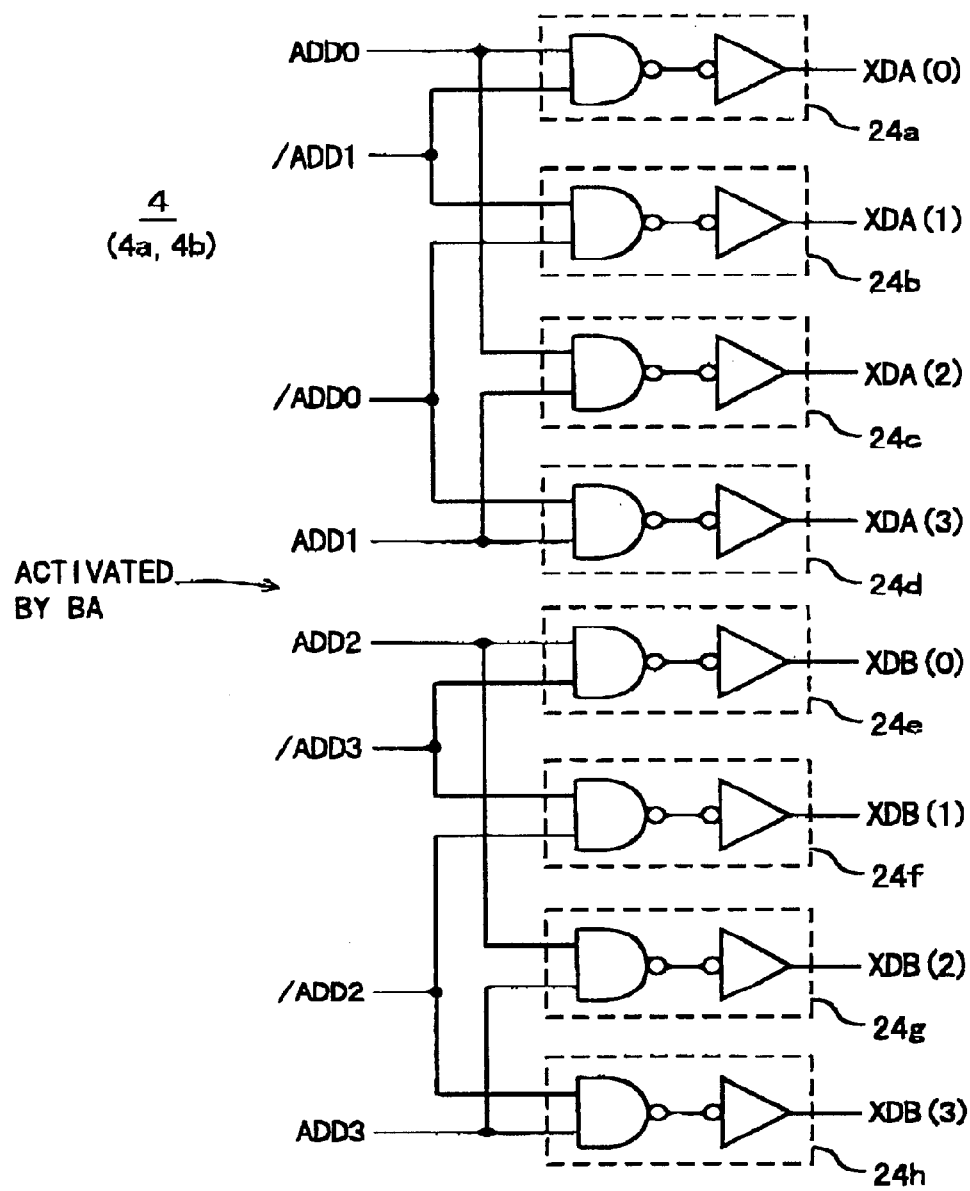
FIG. 6 exemplarily shows a structure of a row decoder included in a row decoder/row-related control circuit shown in FIG. 3.

FIG. 6 schematically shows a structure of row decoders 4a and 4b included in row decoder/row-related control circuits 14a and 14b shown in FIG. 3. FIG. 6 shows the structure, as one example, for predecoding (decoding) 4-bit row address ADD <3:0> as address bits ADD <k:0> for row decoders 4a and 4b. Referring to FIG. 6, row decoder 4 (4a, 4b) includes AND type decode circuits 24a–24d according to address bits ADD0, /ADD0, ADD1 and /ADD1 to generate predecode signals (decode signals, hereinafter simply referred to as decode signals) XDA (0)–XDA (3), and AND type decode circuits 24e–24h according to address bits ADD2, /ADD2, ADD3 and /ADD3 to generate row decode (predecode) signals XDB (0)–XDB (3). Decode circuit 24a receives address bits ADD0 and /ADD1 to generate decode signal XDA (0).

Decode circuit 24b receives address bits /ADD1 and /ADD0 to generate decode signal XDA (1) Decode circuit 24c receives address bits ADD0 and ADD1 to generate decode signal XDA (2). Decode circuit 24d receives address bits /ADD0 and ADD1 to generate decode signal XDA (3).

Decode circuit 24e receives address bits ADD2 and /ADD3 to generate decode signal XDB (0). Decode circuit 24f receives address bits /ADD3 and /ADD2 to generate decode signal XDB (1) Decode circuit 24g receives address bits ADD2 and ADD3 to generate decode signal XDB (2) Decode circuit 24h receives address bits /ADD2 and ADD3 to generate decode signal XDB (3). These decode circuits 24a–24h are activated, when bank designation signal BA is activated, to decode corresponding address bits.

According to these 4-bit addresses, one of decode signals XDA (0) XDA (3) attains the selected state at H level and one of decode signals XDB (0)–XDB (3) attains the selected state. According to a combination of decode signals XDA (0)–XDA (3) and XDB (0)–XDB (3), one of sixteen word lines is selected.

If the number of address bits increases, the number of decode circuits also increases accordingly.

Structure of Sense Amplifier Control Circuit

Figure 7:
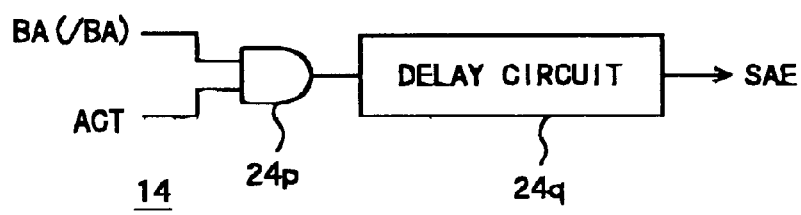
FIG. 7 schematically shows a structure of a sense amplifier included in the row decoder/row-related control circuit shown in FIG. 3.

FIG. 7 schematically shows a structure of a sense amplifier control circuit included in row decoder/row-related control circuits 14a and 14b shown in FIG. 3. Referring to FIG. 7, the sense amplifier control circuit is included in the row-related control circuit, and includes an AND circuit 24p to receive bank designation signal BA (or /BA) and array activation signal ACT, and a rising delay circuit 24q delaying rise of an output signal of AND circuit 24p by a predetermined time. Sense amplifier activation signal SAE (corresponding to RASE0/1 and LSAE0/1 of FIG. 3) is supplied from delay circuit 24q.

When bank designation signal BA (or /BA) is at H level of the selected state, a word line is selected in a corresponding bank according to array activation signal ACT, and subsequently a sensing operation is performed. Delay circuit 24q determines the time required for selection of the word line, transmission of memory cell data onto a bit line and development of a sufficient voltage difference on the bit line pair. When array activation signal ACT attains the inactive state at an L level, delay circuit 24q, being a rise delay circuit, inactivates sense amplifier activation signal SAE in response to inactivation of array activation signal ACT.

In row decoder/row-related control circuit 14 (14a, 14b) shown in FIG. 3, the row-related control circuit activates control signals necessary for row selecting operation successively in a predetermined sequence when bank designation signal BA (or /BA) is in the selected state. Other row-related control signals driven by this row-related control circuit are, as known for the ordinary DRAM, bit line equalize instruction signal, bit line isolation instruction signal, and the like.

Structure of Word Line Driver

Figure 8:
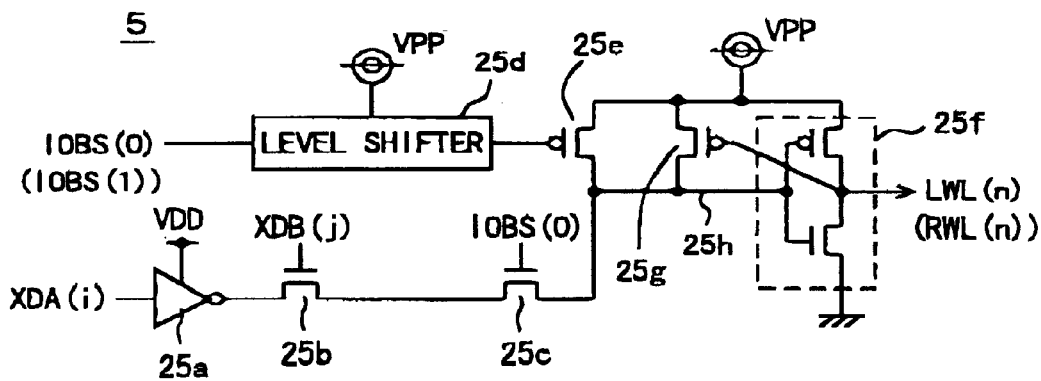
FIG. 8 exemplarily shows a structure of a word line driver included in a word line•SA driver shown in FIG. 3.

FIG. 8 shows one exemplary structure of a word line driver included in word line•SA drivers 5a–5d shown in FIG. 3. Word line drivers included in word line•SA drivers 5a–5d all have the same structure and differ from each other only in supplied block selection signals. FIG. 8 thus representatively shows one word line driver 5. Referring to FIG. 8, the word line driver includes an inverter 25a receiving row decode signal XDA<i>, a transfer gate 25b transmitting an output signal of inverter 25a according to row decode signal XDB (j), a transfer gate 25c rendered conductive according to block selection signal IOBS (0) (or IOBS (1)) to couple transfer gate 25b to a node 25h, a level shifter 25d converting block selection signal IOBS (0) (or IOBS (1)) into a signal with an amplitude of VPP level, a P channel MOS transistor 25e rendered conductive, when an output signal of level shifter 25d is at L level, to transmit high voltage VPP to node 25h, a CMOS inverter 25f inverting an output signal of node 25h to generate word line drive signal LWL (n) (or RWL (n)), and a P channel MOS transistor 25g according to word line drive signal LWL (n) (or RWL (n)) to transmit high voltage VPP to node 25h. Inverter 25a receives, as its operating supply voltage, a voltage (peripheral supply voltage) VDD lower than high voltage VPP. An operation of the word line driver shown in FIG. 8 is now briefly described.

When block selection signal IOBS (0) or IOBS (1) is at L level, the output signal of level shifter 25d is at L level to cause P channel MOS transistor 25e to become conductive, and accordingly node 25h is charged to high voltage VPP level. At this time, transfer gate 25c is in OFF state Regardless of the states of row decode signals XDA (j) and XDB (j), node 25h is at high voltage VPP level and word line drive signal WL (LWL (n) or RWL (n)) stays in the non-selected state.

When block selection signal IOBS (0) (or IOBS (1)) is at H level, the output signal of level shifter 25d is at H level of high voltage VPP level, and accordingly P channel MOS transistor 25e enters OFF state. Transfer gate 25c is in ON state and transfer gate 25b is coupled to node 25h. According to a combination of row decode signals XDA<i> and SCB (j), a voltage level of node 25g is determined.

When both of row decode signals XDA<i> and XDB (j) are at H level, node 25h is driven into L level by inverter 25a, and word line drive signal LWL (n) (or RWL (n)) is accordingly driven into high voltage VPP level. When row decode signal XDB (j) is at H level and row decode signal XDA<i> is at L level, node 25h is at H level, word line drive signal LWL (n) (or RWL (n)) stays at L level, and node 25h is maintained at high voltage VPP level by MOS transistor 25e. Similarly, when row decode signal XDB (j) is at L level, transfer gate 25b is in OFF state, and word line drive signal LWL (n) (or RWL (n)) maintains L level as in the standby state, because MOS transistor 25e is in ON state and node 25h is at high voltage VPP level.

In a selected bank, a word line is selected in a memory sub array designated by block selection signals IOBS (0) and IOBS (1) In the half page mode, one of block selection signals IOBS (0) and IOBS (1) is driven into the selected state. In the normal page mode, both of block selection signals IOBS (0) and IOBS (1) are set in the selected state of H level.

Figure 9:
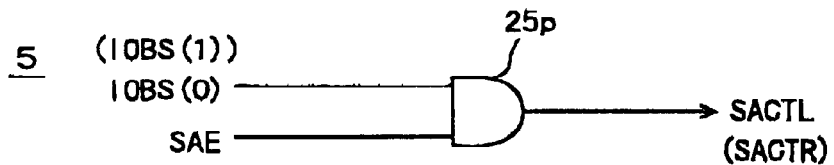
FIG. 9 exemplarily shows a structure of an SA driver included in the word line•SA driver shown in FIG. 3.

FIG. 9 shows one exemplary structure of an SA driver included in word line•SA drivers 5a–5d. SA drivers included in word line•SA drivers 5a–5d have the same structure, and FIG. 9 representatively shows a structure of one SA driver included in word line•SA driver 5. Referring to FIG. 9, the SA driver includes an AND circuit 25p receiving block selection signal IOBS (0) (or IOBS (1)) and sense amplifier activation signal SAE from corresponding row decode/row-related control circuit 14 (14a, 14b). AND circuit 25p outputs sense amplifier circuit activation signal SACTL (or SACTR).

When block selection signal IOBS (0) is at L level, sense amplifier circuit control signal SACTL (SACTR) maintains the inactive state of L level regardless of the state of sense amplifier activation signal SAE, and a sense amplifier of a corresponding memory sub array maintains the inactive state.

When block selection signal IOBS (0) (or IOBS (1)) is in the selected state at H level, sense amplifier circuit activation signal SACTL (SACTR) is activated according to sense amplifier activation signal SAE.

Figure 10:
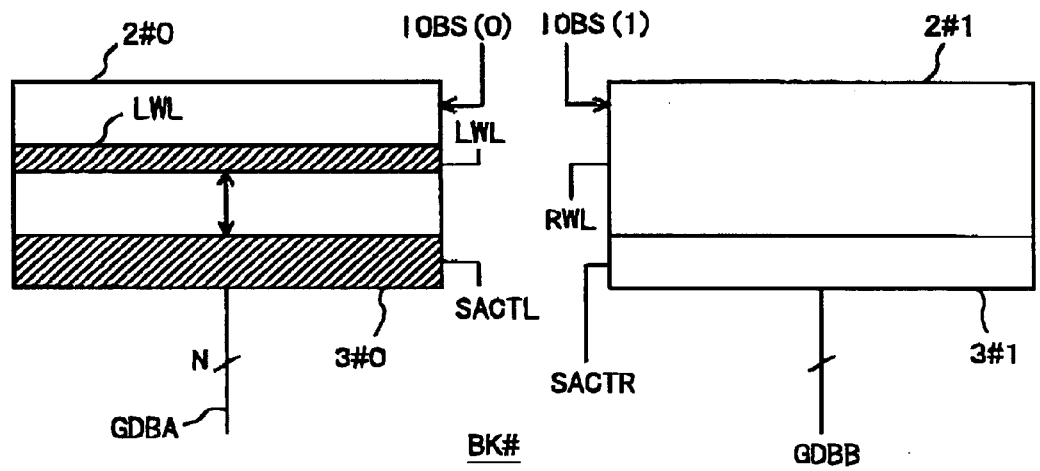
FIG. 10 schematically shows the sense amplifiers in the active state in the first operation mode of the semiconductor memory device according to the invention.

FIG. 10 schematically shows the distribution states of a selected word line and a sense amplifier in the half page mode. In FIG. 10, memory sub arrays 2#0 and 2#1 are shown as memory sub arrays included in a bank BK#. It is supposed now that block selection signal IOBS (0) is in the selected state and block selection signal IOBS (1) is in the non-selected state. In this state, according to word line drive signal LWL, a corresponding word line is driven into a selected in memory sub array 2#0, and sense amplifier 3#0 is activated, according to sense amplifier circuit control signal SACTL, to senses amplify and latch data of selected memory cells on the selected word line LWL. N-bit of the data latched by sense amplifier 3#0 is transmitted to global data bus GDBA in a data reading mode. Block selection signal IOBS (1) is in the non-selected state, word line drive signal RWL and sense amplifier circuit control signal SACTR are in the inactive state, and memory sub array 2#1 and sense amplifier 3#1 maintain a precharge state. In the normal page mode, both of block selection signals IOBS (0) and IOBS (1) are driven into the selected state, row selection is carried out in memory sub arrays 2#0 and 2#1 according to word line drive signals LWL and RWL, and sensing operation is performed by sense amplifiers 3#0 and 3#1 according to sense amplifier circuit control signals SACTL and SACTR.

Structure of Block Selection Signal Generating Unit

Figure 11:
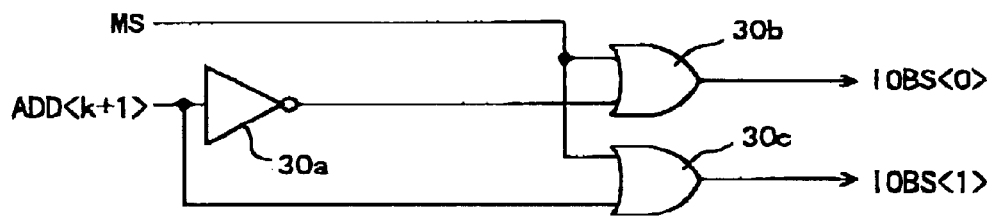
FIG. 11 exemplarily shows a structure of a block selection signal generating unit.

FIG. 11 shows as one example a structure of a unit generating a block selection signal. Referring to FIG. 11, the block selection signal generating unit includes an inverter 30a receiving address bit ADD <k+1>, an OR circuit 30b receiving an output signal of inverter 30a and mode setting signal MS to generate block selection signal IOBS <0>, and an OR circuit 30c receiving address bit ADD <k+1> and mode setting signal MS to generate block selection signal IOBS <1> Mode setting signal MS is supplied from logic circuit 20 as shown in FIGS. 1 and 2.

When mode setting signal MS is at L level to designate the half page mode, these block selection signals IOBS <0> and IOBS <1> are generated according to address bit ADD <k+1>. When the normal page mode is designated and mode setting signal MS is H level, both of the block selection signals IOBS <0> and IOBS <1> are at H level regardless of the logic level of address bit ADD <k+1>. In other words, mode setting signal MS can be used to change the mode between the half page mode and the normal page mode.

Address bit ADD <k+1> is the most significant address bit, for example, address bit ADD <4>.

First Modification of the Block Selection Signal Generating Unit

Figure 12:
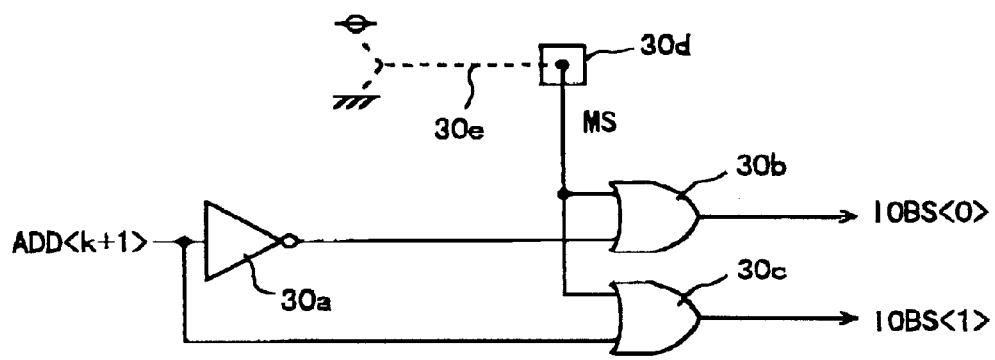
FIG. 12 shows a first modified structure of the block selection signal generating unit.

FIG. 12 shows a structure of a first modification of the block selection signal generating unit. Referring to FIG. 12, one input of each of OR circuits 30b and 30c is coupled to a bonding pad 30d. Bonding pad 30d receives a supply voltage or a ground voltage via a bonding wire or a mask line 30e. In this way, this mode setting signal MS is fixed to the voltage level on bonding pad 30d. This structure shown in FIG. 12 can be used to individually manufacture half page mode products and normal page mode products.

It is noted that in the structure shown in FIG. 12, mode setting signal MS may be generated by a buffer circuit or the like according to the voltage level on bonding pad 30d. Further, a fuse programming circuit may be used to generate this mode setting signal MS. In other words, the logic level of mode setting signal MS may be determined by blowing/non-blowing of a fuse element through a fuse program of the fuse programming circuit. In addition, mode setting signal MS may be coupled to bonding pad 30d to have the voltage level set by mask interconnection lines (coupled to an internal supply line or ground line).

Second Modification of the Block Selecting Signal Generating Unit

Figure 13A:
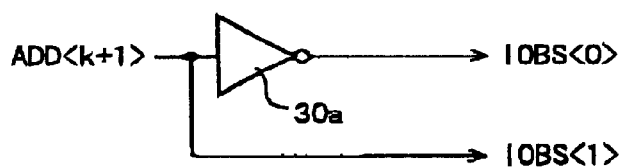
FIGS. 13A and 13B show a second modified structure of the block selection signal generating unit.
Figure 13B:
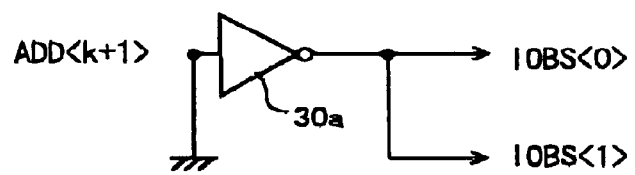

FIGS. 13A and 13B show a structure of a second modification of the block selection signal generating unit. Referring to FIG. 13A, in the half page mode, address bit ADD <k+1> is supplied to inverter 30a. Inverter 30a generates block selection signal IOBS <0>. Address bit ADD <k+1> is used as block selection signal IOBS <1>. In this case, block selection signals IOBS <0> and IOBS <1> are generated according to address bit ADD <k+1>.

FIG. 13B shows a structure of the second modification in the normal page mode. Referring to FIG. 13B, in the normal page mode, address bit ADD <k+1> is not used. The input of inverter 30a is fixed at L level by an interconnection line, and an output of inverter 30a is used to generate block selection signals IOBS <0> and IOBS <1>. In this way, in this normal page mode, block selection signals IOBS <0> and IOBS <1> are always fixed at H level. The mask interconnection is changed to make a change between the half page mode and normal page mode.

It is noted that block selection signals IOBS <0> and IOBS <1> may be generated by AND of the address signal bit and array activation signal ACT. In the circuit using the block selection signals, a precharge state can be ensured in the standby cycle by the combination with the array activation signal.

Structure of Input/Output Buffer

Figure 14:
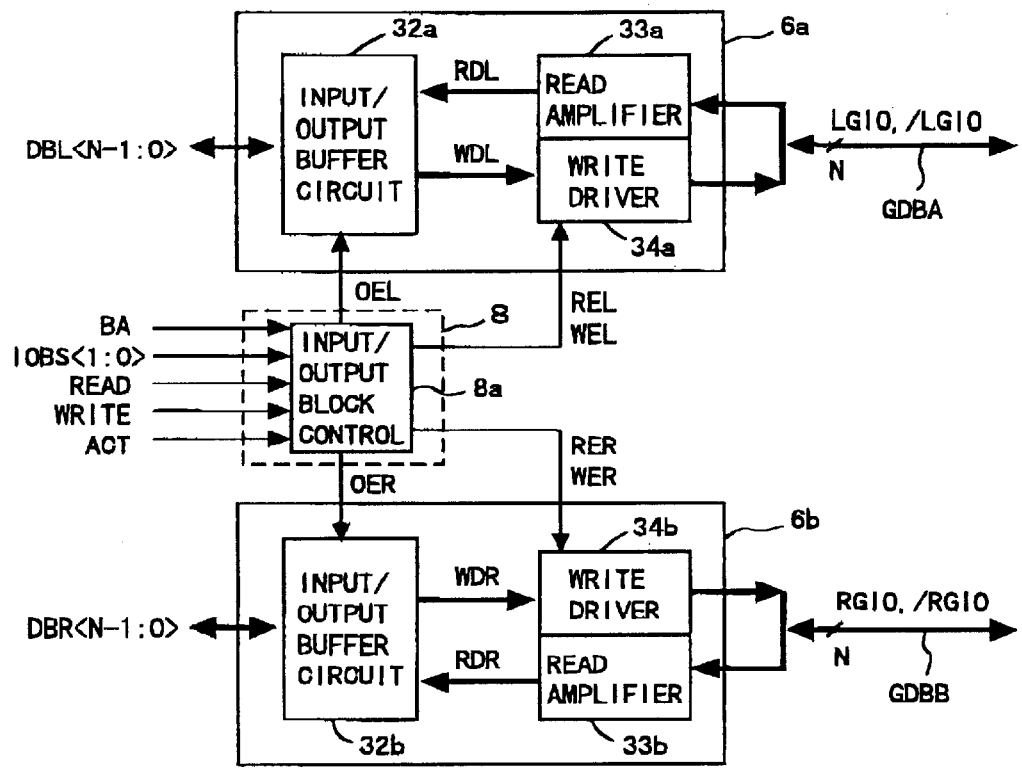
FIG. 14 is a schematic diagram of an input/output buffer and an input/output control unit of the semiconductor memory device according to the invention.

FIG. 14 schematically shows a structure of input/output buffers 6a and 6b shown in FIGS. 1 and 2. Referring to FIG. 14, input/output buffer 6a includes a read amplifier 33a and a write driver 34a coupled to global data bus GDBA, and an input/output buffer circuit 32a coupled to these read amplifier 33a and write driver 34a to transfer internal data. Read amplifier 33a is activated according to read enable signal REL and write driver 34a is activated according to write enable signal WEL. Input/output buffer circuit 32a includes an output circuit outputting internal read data RDL received from read amplifier 33a when output enable signal OEL is activated, and an input circuit receiving and buffering external data to generates internal write data WDL to supply the resultant data to write driver 34a. Global data bus GDBA includes an N-bit pairs of global data lines LGIO and /LGIO.

Input/output buffer 6b includes a read amplifier 33b and a write driver 34b coupled to global data bus GDBB and an input/output buffer circuit 32b for external data transfer. Read amplifier 33b is activated in response to activation of read enable signal RER, and write driver 34b is activated in response to activation of write enable signal WER. Input/output buffer circuit 32b buffers internal read data RDR received from read amplifier 33b in response to activation of output enable signal OER and outputs the resultant data. Further, input/output buffer circuit 32b buffers external data and generates internal write data WDR for transference to write driver 34b. Global data bus GDBB includes a pair of N-bit global data lines RGIO and /RGIO.

Input/output buffer circuits 32a and 32b are coupled to N-bit internal data buses DBL <N−1:0> and DBR <N−1:0>, respectively. These internal data buses DBL <N−1:0> and DBR <N−1:0> are coupled to an IO selector.

Control circuit 8 includes an input/output block control circuit 8a according to bank designation signal BA, block selection signal IOBS <1:0>, read instruction signal READ, write instruction signal WRITE and array activation signal ACT to generate output enable signals OEL and OER, read enable signals REL and RER, and write enable signals WEL and WER.

Figure 15:
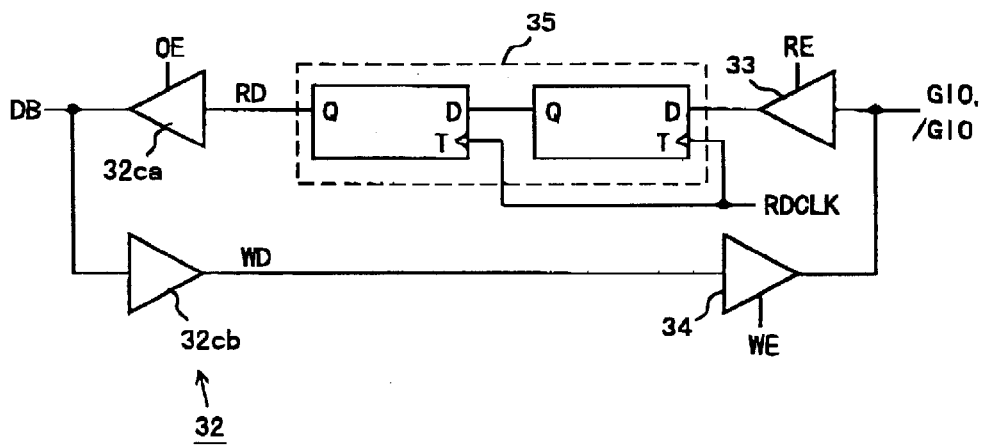
FIG. 15 is a schematic diagram showing a structure of a read amplifier, a write driver and an input/output buffer circuit shown in FIG. 14.

FIG. 15 shows more specific structure of input/output circuits 6a and 6b. FIG. 14 shows a structure of a one-bit circuit of the input/output buffer. Referring to FIG. 15, input/output buffer circuit 32 includes an output buffer 32ca buffering internal read data RD in response to activation of output enable signal OE (OEL, OER), to output the resultant data, and an input buffer 32cb buffering a signal on data bus line DB to generate internal write data WD.

Read amplifier 33 (33a, 33b) differentially amplify data on global data lines GIO and /GIO in response to activation of read enable signal RE (REL, RER), to generate internal read data. Between this read amplifier 33 and output buffer 32a, a latency shift circuit 35 is provided for transferring data in response to rising of read clock signal RDCLK. FIG. 15 shows, as one example, a structure of latency shift circuit 35 formed of D flip-flops of two stages. The latency shifter 35 shifts internal read data for a necessary period according to a clock cycle period required from supply of a read command to actual reading of data to an outside.

Write driver 34 (34a, 34b) generate complementary write data according to internal write data WD received from input buffer 32cb in response to activation of write enable signal WE (WEL, WER), to transmit the generated data onto global data lines GIO and /GIO. The structure shown in FIG. 15 is provided corresponding to each respective pair of bus lines for transfer of N-bit data.

It is noted that latency shift circuit 35 shown in FIG. 15 performs shifting operation for one clock cycle of read clock signal RDCLK. The number of stages of D flip-flops of this latency shift circuit 35 may appropriately determined according to read latency of a DRAM (DRAM macro).

Structure of Input/Output Block Control Circuit 8a

Figure 16:
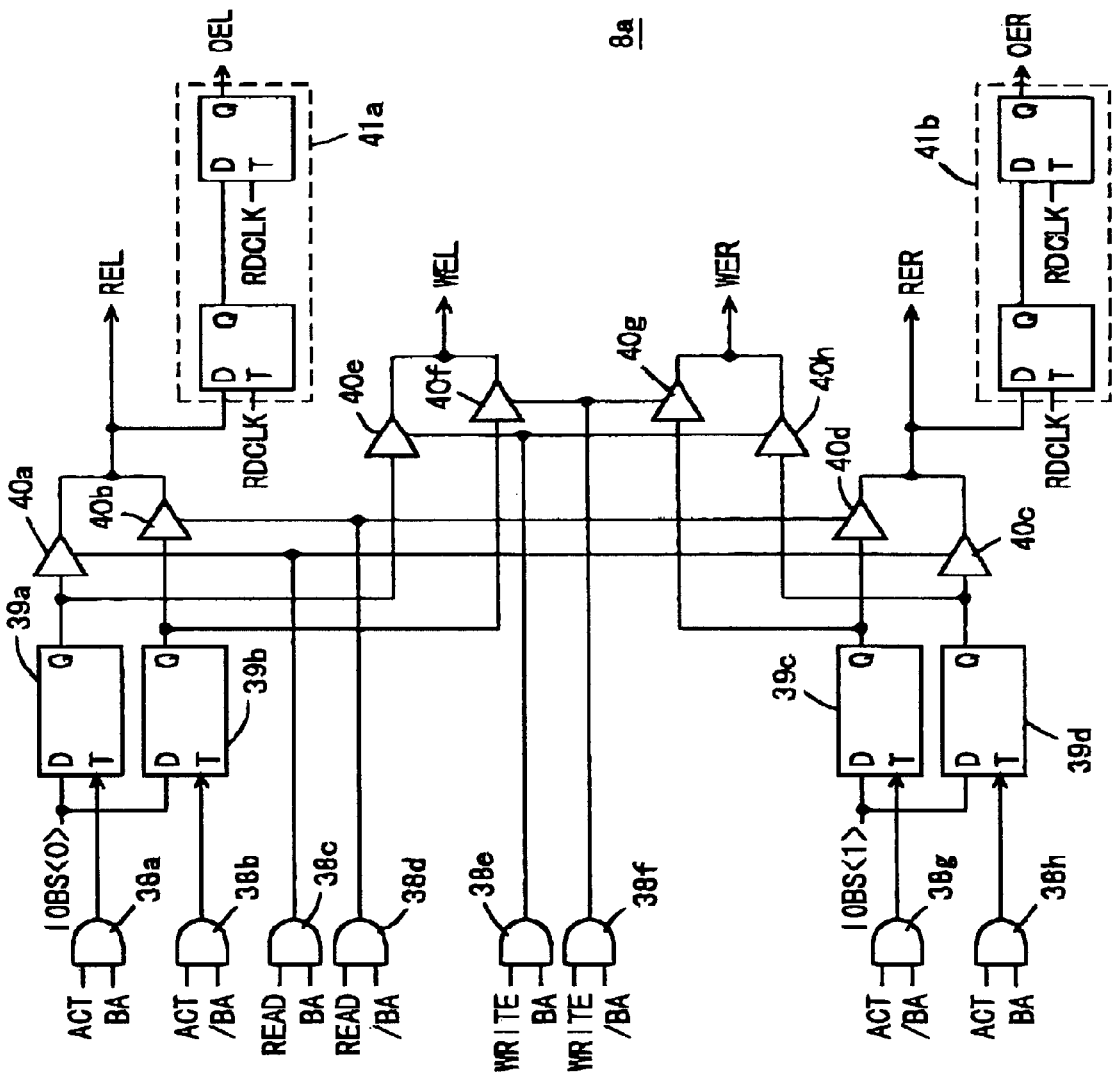
FIG. 16 shows a structure of an input/output circuit shown in FIG. 14.

FIG. 16 schematically shows a structure of input/output block control circuit 8a shown in FIG. 14. Referring to FIG. 16, input/output block control circuit 8a includes an AND circuit 38a receiving array activation signal ACT and bank designation signal BA, an AND circuit 38b receiving array activation signal ACT and bank designation signal /BA, an AND circuit 38c receiving read instruction signal READ and bank designation signal BA, an AND circuit 38d receiving read instruction signal READ and bank designation signal /BA, an AND circuit 38e receiving write instruction signal WRITE and bank designation signal BA, an AND circuit 38f receiving write instruction signal WRITE and bank designation signal /BA, an AND circuit 38g receiving array activation signal ACT and bank designation signal /BA, an AND circuit 38h receiving array activation signal ACT and bank designation signal BA. Bank designation signal BA designates bank BK#0 when activated (at H level), and bank designation signal /BA designates bank BK#1 when activated.

Input/output block control circuit 8a further includes a D flip-flop 39a to take in and output block selection signal IOBS <0> in response to rising of an output signal of AND circuit 38a, a D flip-flop 39b to take in and output block selection signal IOBS <0> in response to rising of an output signal of AND circuit 38b, a D flip-flop 39c to take in and output block selection signal IOBS <1> in response to rising of an output signal of AND circuit 38g, and a D flip-flop 39d to take in and output block selection signal IOBS <1> in response to rising of an output signal of AND circuit 38h.

These D flip-flops 39a–39d take in block selection signals IOBS <0> and IOBS <1> when an active command is supplied and array activation instruction signal ACT is driven into the active state. Thus, writing/reading of data can be performed to a memory sub-array in which row selection is performed and data of selected memory cells on a selected row are latched by the sense amplifiers according to the activation signals in the designated bank. When a precharge command is supplied to perform precharge operation of driving the selected memory sub array of the selected bank into the non-selected state, the latched data of these D flip-flops 39a–39d are reset (the path of this operation is not shown).

Input/output block control circuit 8a further includes a tristate buffer 40a activated, when an output signal of AND circuit 38c is active, to buffer a signal received from output Q of D flip-flop 39a to generate read enable signal REL, a tristate buffer 40b activated, when an output signal of AND circuit 39d is active, to buffer a signal received from output Q of D flip-flop 39b to generate read enable signal REL, and a shift circuit 41a transferring output signals of tristate buffers 40a and 40b according to read clock signal RDCLK to generate output enable signal OEL. This shift circuit 41a includes D flip-flops of two stages and these two-stage D flip-flops receive read dock signal RDCLK at their dock inputs T. Shift circuit 41a activates output buffer 32ca after read amplifier 33 is activated, with data transfer of latency shift circuit 35 shown in FIG. 15 taken into account.

Input/output block control circuit 8a further includes a tristate buffer 40c activated, when an output signal of AND circuit 38c is active, to buffer an output signal of D flip-flop to generate read enable signal RER, a tristate buffer 40d activated, when an output signal of AND circuit 38d is active, to buffer an output signal of D flip-flop 39c to generate read enable signal RER, tristate buffers 40e and 40h activated, when an output signal of AND circuit 38e is active, to buffer output signals of respective D flip-flops 39*a* and 39*d* to generate write enable signals WEL and WER, and tristate buffers 40*f* and 40*g* activated, when an output signal of AND circuit 38*f* is active, to buffer output signals of respective D flip-flops 39*b* and 39*c* to generate write enable signals WEL and WER.

Shift circuit 41*a* delays read enable signal REL by one clock cycle period of read dock signal RDCLK to generate output enable signal OEL. Shift circuit 41*b* delays read enable signal RER by one clock cycle period of read clock signal RDCLK to generate output enable signal OER. These shift circuits 41*a* and 41*b* are each constituted of D flip-flops of two stages that take in and latch signals supplied thereto respectively in response to rising of read clock signal RDCLK.

It is supposed here that array activation signal ACT for bank BK#1 is supplied according to bank designation signal BA and thus word line selection and sensing operation on a memory cell data are performed in bank BK#1. In this state, when block selection signal IOBS <0> is at H level, the output signal of D flip-flop 39*a* is at H level. The output signal of D flip-flop 39*b* varies depending on the state of bank BK#0 designated by bank designation signal/BA. When bank BK#0 is in a precharge state, the output signal of D flip-flop 39*b* is at L level (because the signal is reset in precharging).

In this state, when bank designation signal BA and read instruction signal READ are supplied, the output signal of AND circuit 38*c* is at H level and tristate buffer 40*a* is activated. According to the output signal of D flip-flop 39*a*, read enable signal REL is activated so that data of a selected memory cell of memory sub array 2*a* of bank BK#1 is read. After one dock cycle of read clock signal RDCLK passes, output enable signal OEL is activated.

Here, read clock signal RDCLK may be activated for a predetermined period to be generated according to clock signal CLK supplied to the control circuit when data reading instruction is issued. Alternately, this read clock signal RDCLK may be generated according to dock signal CLK all the time. If read instruction signal READ is supplied together with bank designation signal/BA, the output signal of tristate buffer 40*b* is at L level when the output signal of D flip-flop 39*b* is at L level. Read enable signal RED accordingly stays in the inactive state. In this way, even when data reading instruction for a non-selected (in the precharge state) bank is applied, access to that bank can surely be inhibited. Similar operation is done for data writing.

Data writing/reading is accordingly performed only when an active command is supplied and subsequently read command or write command is issued for one bank. In the half page mode, one of block selection signals IOBS <0> and IOBS <1> is driven into the selected state. In the normal page mode, both of block selection signals IOBS <0> and IOBS <1> are in the active state of H level. When read command or write command is provided after active command is applied for one bank, read enable signals REL and RER or write enable signals WEL and WER are activated according to output signals of D flip-flops 39*a*–39*d* through tristate buffers 40*a*–40*h*.

General Reading Operation

Figure 17:
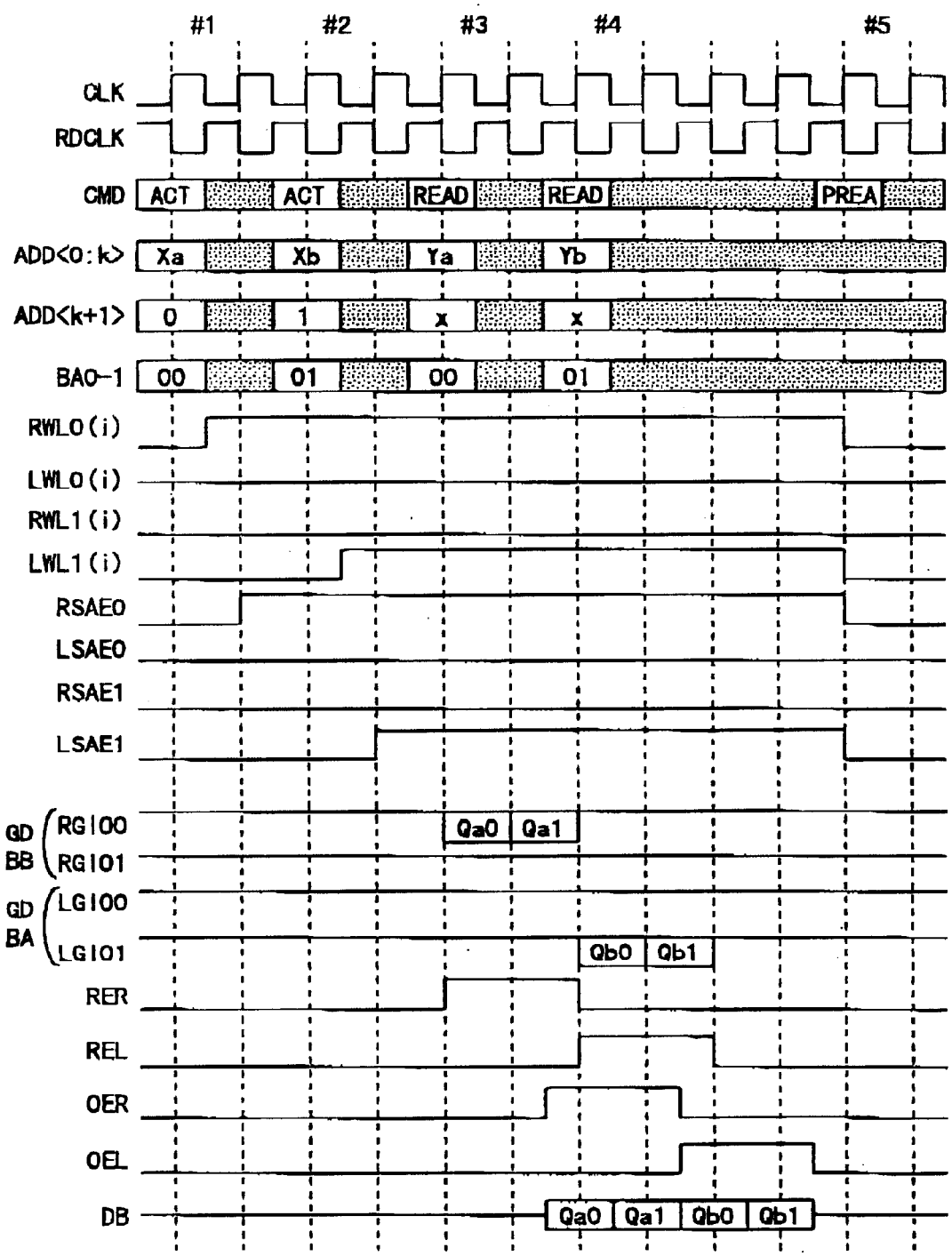
FIG. 17 is a timing chart representing a data reading operation in a half page mode of the semiconductor memory device according to the invention.

FIG. 17 is a timing chart representing an operation in data reading of the DRAM according to the present invention. The operation in data reading is now described briefly in conjunction with the timing chart shown in FIG. 17.

In cycle #1 of clock signal CLK, active command CMD is supplied. According to this active command, array activation instruction signal ACT is activated. At this time, address signal ADD <0:k>, block designation signal (block address bit) ADD <k+1> and bank selection signal BA (BA0, BA1) are also supplied. Bank BK#0 is accordingly designated and block selection signal IOBS <1> is activated according to address bit ADD <k+1>. The description here concerns an operation in the half page mode. Read clock signal RDCLK is a signal complementary to clock signal CLK.

Here, the inverted signal of address bit ADD <k+1> is block selection signal IOBS <0>(see FIG. 13A). In this bank BK#0, word line RWL0 (j) is activated by word line•SA driver 5*d* (see FIG. 3) according to address signal Xa, and word line RWL0 (i) is driven into the selected state in memory sub array 2*d*.

In dock cycle #2, the active command is supplied again and responsively array activation instruction signal ACT is activated. At this time, address bit ADD <k+1> is "1", and block selection signal IOBS <0> is driven into the selected state. Bank address BA (BA0, BA1) designates bank BK#1. Under the control by row decoder/row-related control circuit 14*a* shown in FIG. 3, word line drive signal LWL1 is activated and word line LWL1 (j) is driven into the selected state in memory sub array 2*a*. When word lines RWL0 (i) and LWL1 (j) are selected, according to row decoder/row-related control circuits 14*b* and 14*a*, sense amplifier activation signals RSAE0 and LSAE1 are activated. Accordingly, in banks BK#0 and BK#1, sensing, amplification and latch of data in memory cells of memory sub arrays 2*d* and 2*a* are carried out.

Next, in clock cycle #3, a read command is supplied to activate read instruction signal READ. At this time, bank BK#0 is designated. In data reading, address bit ADD <k+1> is arbitrary in logic level since a memory sub array for data access operation (data reading/writing) is specified by D flip-flops 39*a*–39*d* according to the array activation instruction signal as shown in FIG. 16.

Block selection signal IOBS <0> is in the selected state in bank BK#0. In this memory sub array 2*c*, according to Y address Ya, memory cell selection is performed and read data Qa0 and Qa1 are transmitted onto global data bus RGIO. The operation represented here is for the burst length of 2, and N-bit data Qa0 and Qa1 are successively selected.

When data is read onto this global data bus RGIO, tristate buffer 40*d* shown in FIG. 16 activates read enable signal RER. Read amplifier 33*b* shown in FIG. 14 is activated and subsequently output enable signal OER is activated. The state is shown, as an example, in which output enable signal OER is delayed by 1.5 clock cycle with respect to read enable signal RER In response to activation of output enable signal OER, data Qa0 and Qa1 are successively output. Data Qa0 and Qa1 are transferred according to read clock signal RDCLK. Read clock signal RDCLK is a signal complementary to clock signal CLK. Therefore, at the rising edge of clock signal CLK, data Qa0 and Qa1 are in a defined state.

Next, in clock cycle #4, the read command is issued again to cause access to data for bank BK#1 according to read instruction signal READ. In memory sub array 2*a* of bank BK#1, data Qb0 and Qb1 are successively read onto global data bus RGIO Following this read command, read enable signal REL and output enable signal OEL are activated again and N-bit data Qb0 and Qb1 are successively output.

In clock cycle #5, precharge command PREA is supplied to return all the banks into the precharge state, and the selected word lines and sense amplifiers are all driven into the inactive state.

Figure 18:
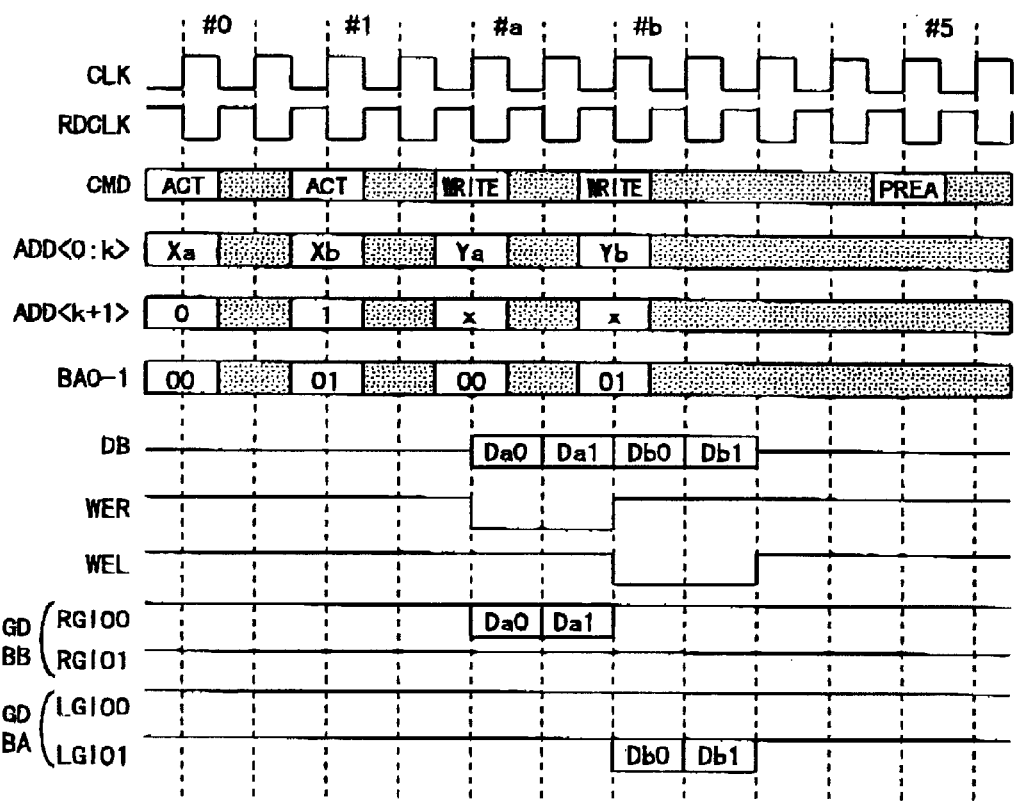
FIG. 18 is a timing chart representing a data writing operation in the half page mode of the semiconductor memory device according to the invention.

FIG. 18 is a timing chart representing data writing operation in the half page mode. In data writing, similarly to the data reading represented in FIG. 17, an active command is supplied in dock cycles #0 and #1 and row selecting operation is performed in banks BK#0 and BK#1, respectively. According to address bit ADD <k+1>, block selection signals IOBS <1> and IOBS <0> are activated for banks BK#0 and BK#1, respectively.

When sensing operation is completed according to this activate command in memory sub arrays 2d and 2a designated by block selection signals IOBS <1> and IOBS <0> in banks BK#0 and BK#1, in clock cycle #a, a write command instructing data writing is supplied, and write instruction signal WRITE is activated. In the data writing, write data Da0 and Da1 are simultaneously supplied with the write command in synchronization with clock signal CLK. Following the write command, write enable signal WER is activated according to tristate buffer 40g shown in FIG. 16. N-bit write data Da0 and Da1 are transmitted onto global data lines RGIO (GDBB) via write driver 34b. In FIG. 18, global data line RGIO0 is arranged for bank BK#0, and global data line RGIO1 is arranged for bank BK#1. These data lines extend continuously. In order to indicate that write data is transmitted for bank BK#0, these global data lines RGIO0 and RGIO1 are shown separately.

In clock cycle #b, the write command is supplied again and bank BK#1 is simultaneously designated. In this case, according to column address signal Yb, column selection is internally performed and write enable signal WEL is activated by tristate buffer 40e shown in FIG. 16. Write data Db0 and Db1 are transmitted onto global data lines RGIO1 (GDBA) and write data is transmitted to memory sub array 2a of bank BK#1.

It is noted that in the reading/writing operation represented in FIGS. 17 and 18, data transfer is performed synchronously with the rise of clock signal CLK. However, data may be transferred synchronously with both of the rising and falling edges of clock signal CLK. Although the burst length shown in FIGS. 17 and 18 is 2, the burst length may be 1 or other numerical value such as 4.

A combination of a plurality of control signals may be supplied as command CMD designating an operation mode from logic circuit 20. An operation mode instruction signal generated by decoding these signals may be supplied to the DRAM macro as a command.

In the normal page mode, the operation is similar to that accomplished by the structures shown in FIGS. 17 and 18. In the normal page mode, the state of address bit ADD <k+1> is set in the state of "don't care (X)".

No specific explanation on the operation in column selection is developed here. In column selection, just a column selection is performed according to a column address. Depending on the configuration of a column decoder generating a column selection signal, the controlling manner for the column decoder differs. Specifically, if a column decoder is commonly provided to memory sub arrays aligned in the column direction, a column selection signal is transmitted on a column selection line extending in the column direction over the aligned memory sub arrays. In this structure, a column decoder is provided commonly to banks BK#0 and BK#1. Therefore, a column decoder is first activated according to block selection signals IOBS <0> and IOBS <1>. Next, according to a combination (AND) signal of a bank designation signal generated according to a bank address and a column selection signal, conduction/non-conduction of a column selection gate connecting a memory cell column (sense amplifier) and a global data line is controlled.

If the column decoder is aligned with a row decoder, the column selection signal is transmitted on a column selection line extending in the row direction. A column decoder is arranged for each bank. In this structure, according to a bank designation signal generated based on a bank address as well as block selection signals IOBS <0> and IOBS <1>, activation/inactivation of the column decoder is controlled. In a selected bank, a column decoder provided corresponding to a memory sub array designated by block selection signal IOBS <i> in a selected bank is activated.

It is noted that a bank address for column selection is supplied together with a column access command (read command or write command) in column access (data writing/reading). As for the column selecting operation activation signal generated based on a bank address for column decoder activation, it may be activated in accordance with the following method. A bank address applied together with an active command is taken in and latched, and when the latched bank address designates a corresponding bank, the column selecting operation activation signal according to a bank address supplied in column access may be made valid. According to such a method, only when the active command and the column access command are supplied in a correct order for one bank, column selection is allowed.

Structure of IO Selector

Figure 19A:
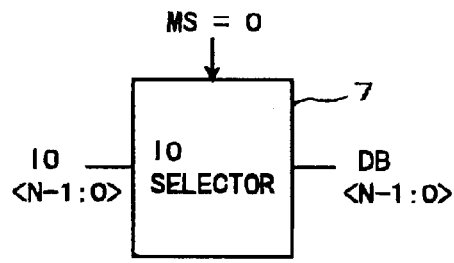
FIGS. 19A and 19B each schematically show a structure of an IO selector shown in FIG. 3.

FIG. 19A schematically shows connection by the IO selector in the half page mode. Referring to FIG. 19A, IO selector 7 (7a or 7b) connects internal data bus DB <N–1:0> of a corresponding input/output buffer to data bus IO <N–1:0> in a one to one connection relationship in response to the mode setting signal MS being 0. In this way, data access is performed for N-bit memory cells selected in one memory sub array.

Figure 19B:
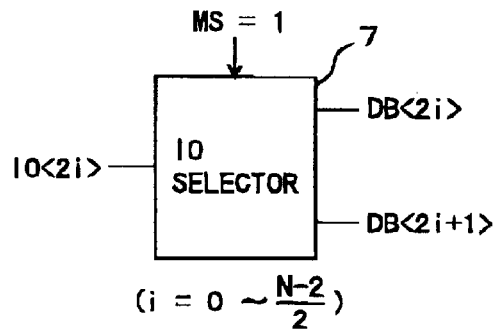

Referring to FIG. 19B, in the normal page mode, mode setting signal MS is set at "1", and IO selector 7 selects one of internal data lines DB <2i>, where i=0(N–2)/2 and DB <2i+1> to connect the selected one to data transmission line IO <2i>. In other words, in the normal page mode, IO selector 7 performs 2 to 1 selection, or selects one of two internal data lines. In other words, further selection is done for N-bit memory cells selected in one memory sub array, and consequently, N/2-bit memory cells are selected from the selected N-bit memory cells. In the normal page mode, N/2-bit data access is performed for one memory sub array, and two memory sub arrays are simultaneously subjected to data access, so that total N-bit data access is accomplished. As for external logic, in both of the normal page mode and half page mode, N-bit data transfer is performed.

Figure 20A:
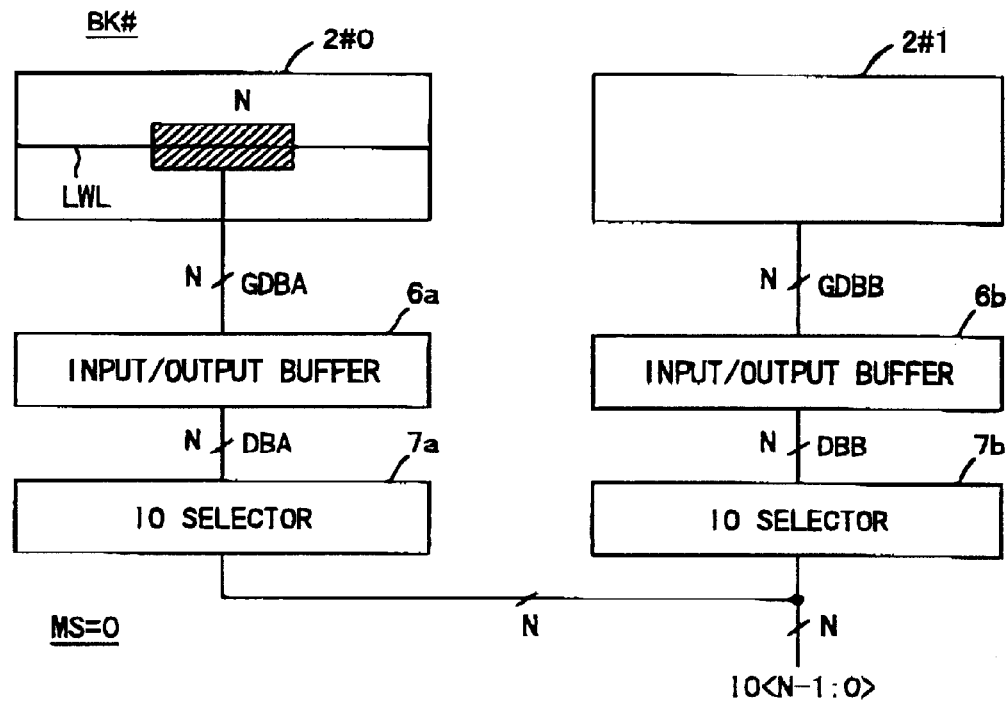
FIG. 20A schematically shows data line connection by the IO selector in the first operation mode, and FIG. 20B schematically shows data line connection in the second operation mode.

FIG. 20A schematically shows the manner in which selected memory cells and memory external data buses (data buses) are connected in the half page mode designated by the mode setting signal MS being 0. Referring to FIG. 20A, in data access, N-bit memory cells are selected by a column selection circuit from memory cells on selected word line LWL to be coupled to global data bus GDBA and further coupled to internal data bus DBA via input/output buffer 6a. In the half page mode, IO selector 7a couple N-bit internal data bus DBA connected to input/output buffer 6a to N-bit IO data bus IO <N–1:0>. In this half page mode, memory sub array 2#1 is in the non-selected state and input/output buffer 6b is in an output high impedance state. Even if IO selector 7b is constituted of a transmission gate, for example, input/output buffer 6b which is not selected never influences data read from IO selector 7a.

Figure 20B:
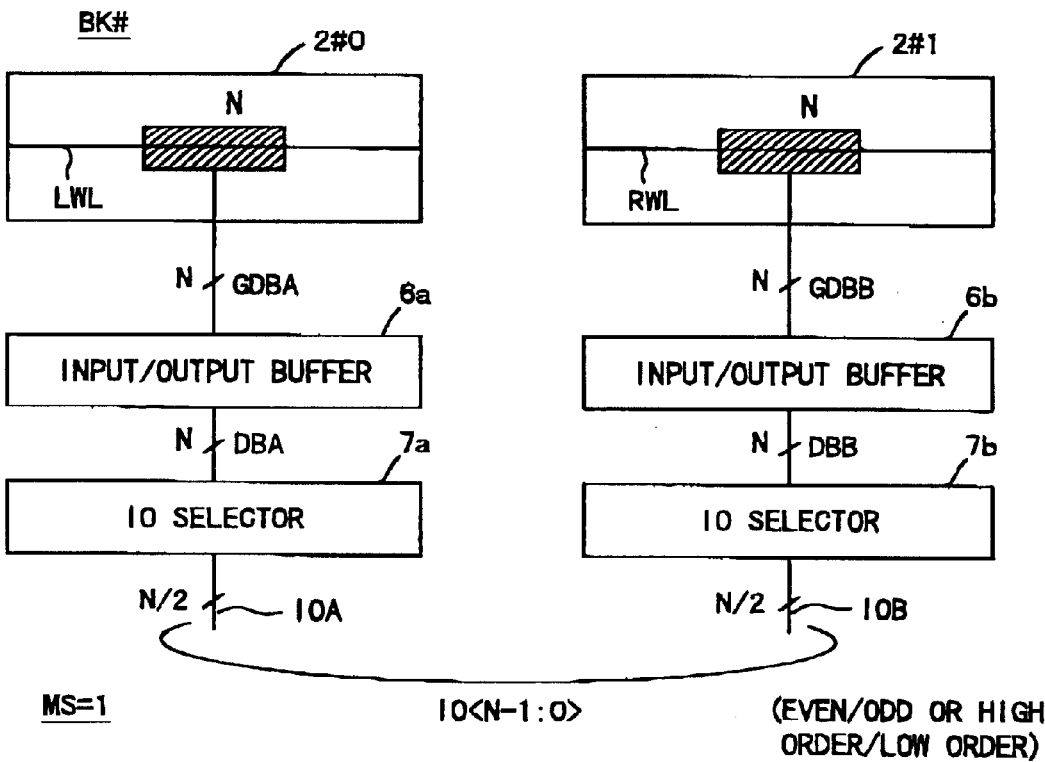

FIG. 20B schematically shows a correspondence between selected memory cells and memory external data buses in normal page mode. In this normal page mode, word lines LWL and RWL are selected in memory sub arrays 2#0 and 2#1. From memory cells on word lines LWL and RWL, N-bit memory cells are selected to be coupled to each of global data buses GDBA and GDBB. Input/output buffers 6a and 6b transfer data between N-bit global data buses GDBA and GDBB and respective N-bit internal data buses DBA and DBB. IO selectors 7a and 7b perform a 2 to 1 selection for coupling to sub data buses IOA and IOB, respectively. Each of sub data buses IOA and IOB has a bit width of N/2. These sub data buses IOA and IOB form N-bit IO data bus IO <N−1:0>. IO selectors 7a and 7b allows to set a page size according to mode setting signal MS. Sub data buses IOA and IOB may be even and odd numbered data lines or higher order data lines and lower order data lines of IO data bus IO <N−1,0>.

Interconnection between IO selectors 7a and 7b and logic circuit 20 through IO data bus IO <N−1:0>(outside the memory) may be fixed according to the page size. Specifically, in the half page mode, input/output nodes of IO selectors 7a and 7b are commonly coupled to input/output nodes of the logic circuit in a one to one correspondence relationship. In the normal mode, input/output nodes of IO selectors 7a and 7b are coupled to the data input/output node of the logic circuit such that they never conflict with each other. For example, sub data bus IOB is used as even number data bus lines or higher order data bus lines and sub data bus IOB is used as odd number data bus lines or lower order data bus lines.

Figure 21:
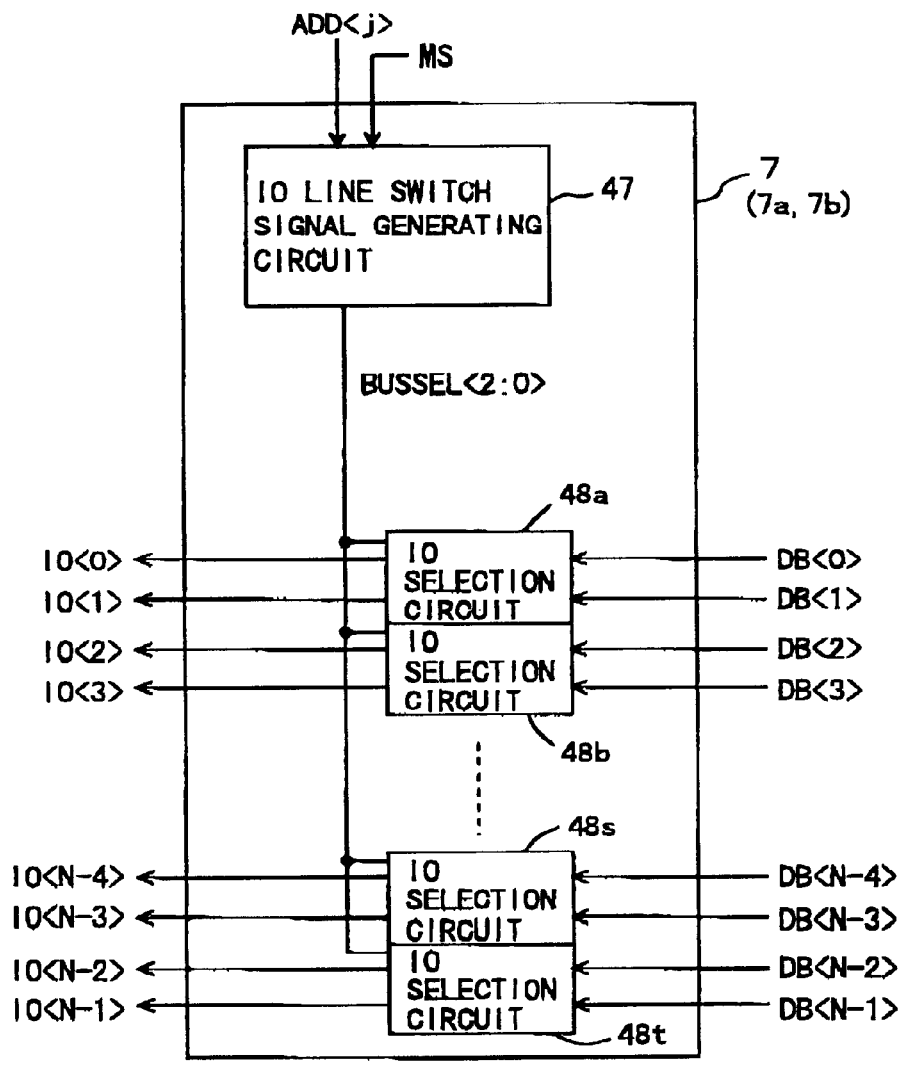
FIG. 21 schematically shows a structure of an I/O selector shown in FIGS. 1 and 2.

FIG. 21 shows a specific structure of IO selector 7. Referring to FIG. 21, IO selector 7 (7a, 7b) includes an IO line switch signal generating circuit 47 according to address bit ADD <j> supplied in column selection and mode setting signal MS to generate IO line switch signals BUSSEL <2:0>, and IO selection circuits 48a–48t each provided corresponding to data lines forming a pair of internal data bus lines to change connection between internal data lines and corresponding data line IO according to IO line switch signals BUSSEL <2:0>.

IO selection circuit 48 (48a–48t) selectively connects corresponding internal data bus lines DB <2i> and DB <2i+1> to corresponding data bus lines IO <2i> and IO A <2i+1>, where i=0 to (N−1)/2. One of internal data bus lines DB <2i> and DB <2i> is selected in the half page mode to be connected to internal data line IO <2i>. In the normal page mode, IO selection circuits 48a–48t connect data bus lines DB <0>–DB <n−1> to corresponding data bus lines IO<0>–IO <n−1> in a one to one correspondence relationship, respectively.

Figure 22:
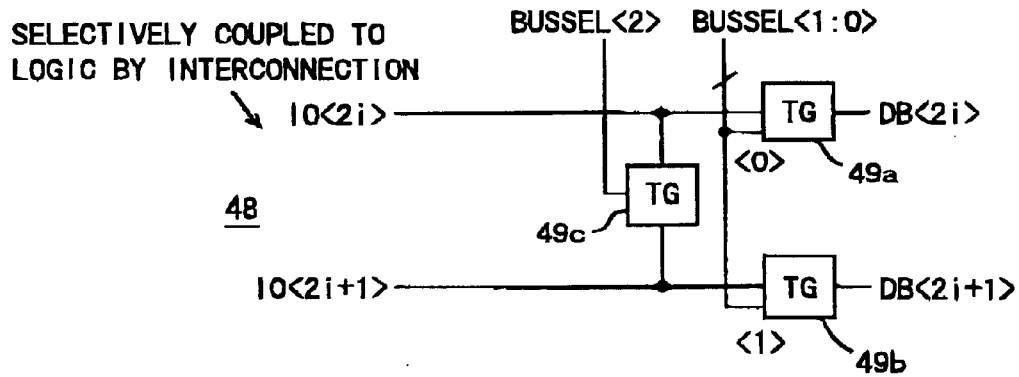
FIG. 22 schematically shows a structure of an IO selection circuit shown in FIG. 21.

FIG. 22 schematically shows a structure of IO selection circuits 48a–48t shown in FIG. 21 IO selection circuits 48a–48t have the same structure, and thus one IO selection circuit 48 is representatively shown in FIG. 22. Referring to FIG. 22, IO selection circuit 48 includes a transfer gate (TG) 49a according to bus selection signal BUSSEL <0> to couple data lines DB <2i> and IO <2i> together, a transfer gate (TG) 49b according to IO line switch signal BUSSEL <1> to couple data line DB <2i+1> and IO <2i+1> together, and a transfer gate (TG) 49c according to IO line switch signal BUSSEL <2> to couple data lines IO <2i> and IO <2i+1> together.

In the half page mode, transfer gate 49c is in OFF state and transfer gates 49a and 49b are both in the conductive state. Therefore, in the half page mode, data lines DB <2i> and DB <2i+1> are coupled to data lines IO <2i> and IO <2i+1>, respectively. In the normal page mode, transfer gate 49c is in ON state and data lines IO <2i> and IO <2i+1> are short-circuited. Transfer gates 49a and 49b become conductive selectively according to IO line switch signals BUSSEL <1:0>. In this normal page mode, IO line switch signals BUSSEL <1:0> are generated according to address bit ADD <j> supplied in column access.

If the page size of this DRAM is determined by metal interconnection, data line IO <2i> from IO selector 7a is connected to an even number data node of the logic circuit, for example, and internal data line IO <2i> from the other IO selector 7b is coupled to an odd number data input/output node, for example, of the logic circuit. In this way, even in the normal page mode, data transfer is accomplished without collision of data. In the half page mode, respective input/output nodes of each of IO selectors 7a and 7b are coupled to data input/output nodes of the logic circuit in a one to one correspondence relationship. Specifically, data line IO <i> of IO selector 7a and data line IO <i> of IO selector 7b are coupled to the same data input/output node of the logic circuit.

Figure 23:
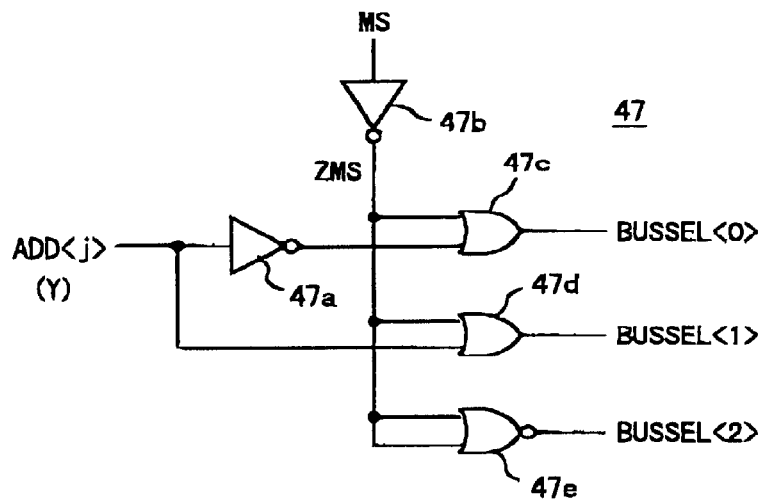
FIG. 23 exemplarily shows a structure of an IO line switch signal generating circuit shown in FIG. 21.

FIG. 23 shows one example of a structure of IO line switch signal generating circuit 47 shown in FIG. 21. Referring to FIG. 23, IO line switch signal generating circuit 47 includes an inverter 47a inverting column address (Y address) bit ADD <j>, an inverter 47b inverting mode setting signal MS, an OR circuit 47c receiving output signals of inverters 47a and 47b to generate IO line switch signal BUSSEL <0>, an OR circuit 47d receiving column address bit ADD <j> and an output signal of inverter 47b to generate IO line switch signal BUSSEL <1>, and an NOR circuit 47e receiving, at its two inputs, an output signal of inverter 47b to generate IO lines switch signal BUSSEL <2>.

In the half page mode, mode setting signal MS is set at L level and inverter 47b generates the output signal ZMS of H level. Responsively, IO line switch signals BUSSEL <0> and BUSSEL <1> are both at H level and transfer gates 49a and 49b shown in FIG. 22 both enter the ON state.

NOR circuit 47e receives the signal ZMS at H level at both inputs, and IO line switch signal BUSSEL <2> is set at L level. Transfer gate 49c shown m FIG. 22 is in OFF state, and data lines IO <2i> and IO <2i+1> are isolated.

In the normal page mode, mode setting signal MS is set at H level and accordingly, the output signal ZMS of inverter 47b is at L level. IO line switch signals BUSSEL <0> and BUSSEL <1> from OR circuits 47c and 47d vary according to column address bit ADD <j>. IO line switch signal BUSSEL <2> from NOR circuit 47e is at H level, transfer gate 49c shown in FIG. 22 is in ON state, and data lines IO <2i> and IO <2i+1> are coupled together.

In this normal page mode, OR circuits 47c and 47d operate as buffer circuits. Therefore, one of IO line switch signals BUSSEL <0> and BUSSEL <1> is at H level and the other is at L level in data access. One of transfer gates 49a and 49b shown in FIG. 22 is in ON state, and data is transmitted to data lines IO <2i> and IO <2i+1>. In the normal page mode, an interconnection line is used for coupling data line IO <2i> to the data input/output node of the logic circuit. Thus, even if IO selectors 7a and 7b have the same structure and perform the same selecting operation, the operation mode is fixed, and N-bit data can be transferred through the fixedly arranged interconnection lines without data collision.

Modification of IO Selector

Figure 24:
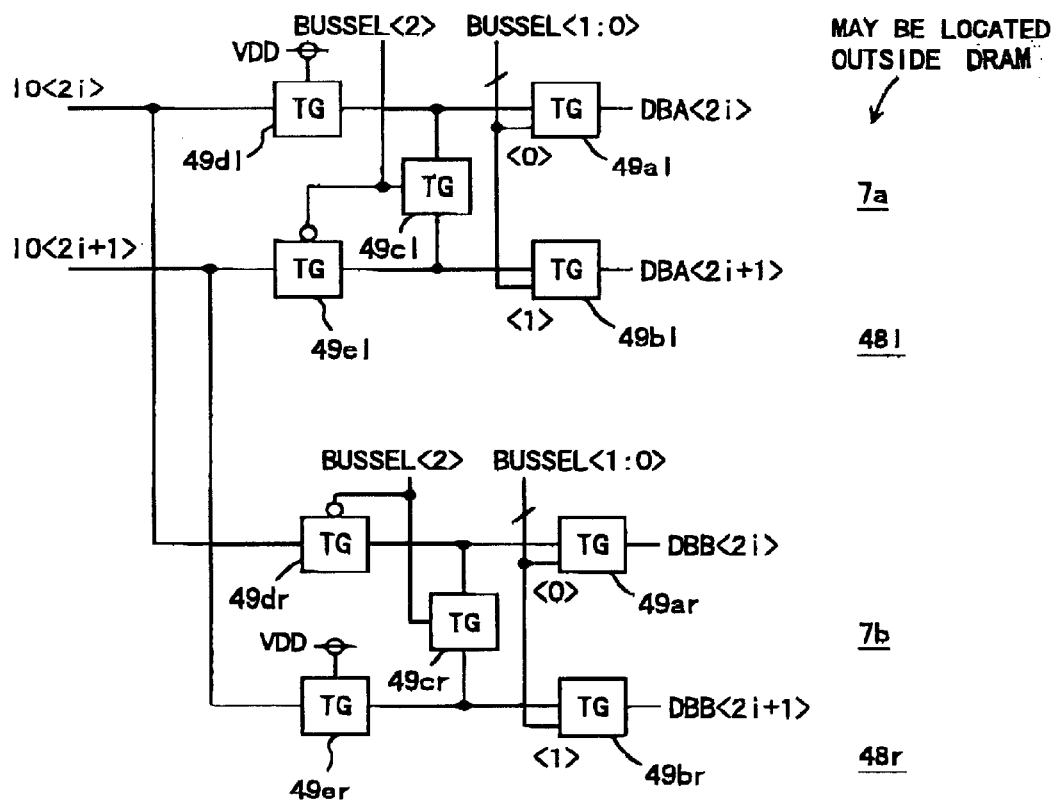
FIG. 24 shows a modification of the I/O selector.
Figure 25:
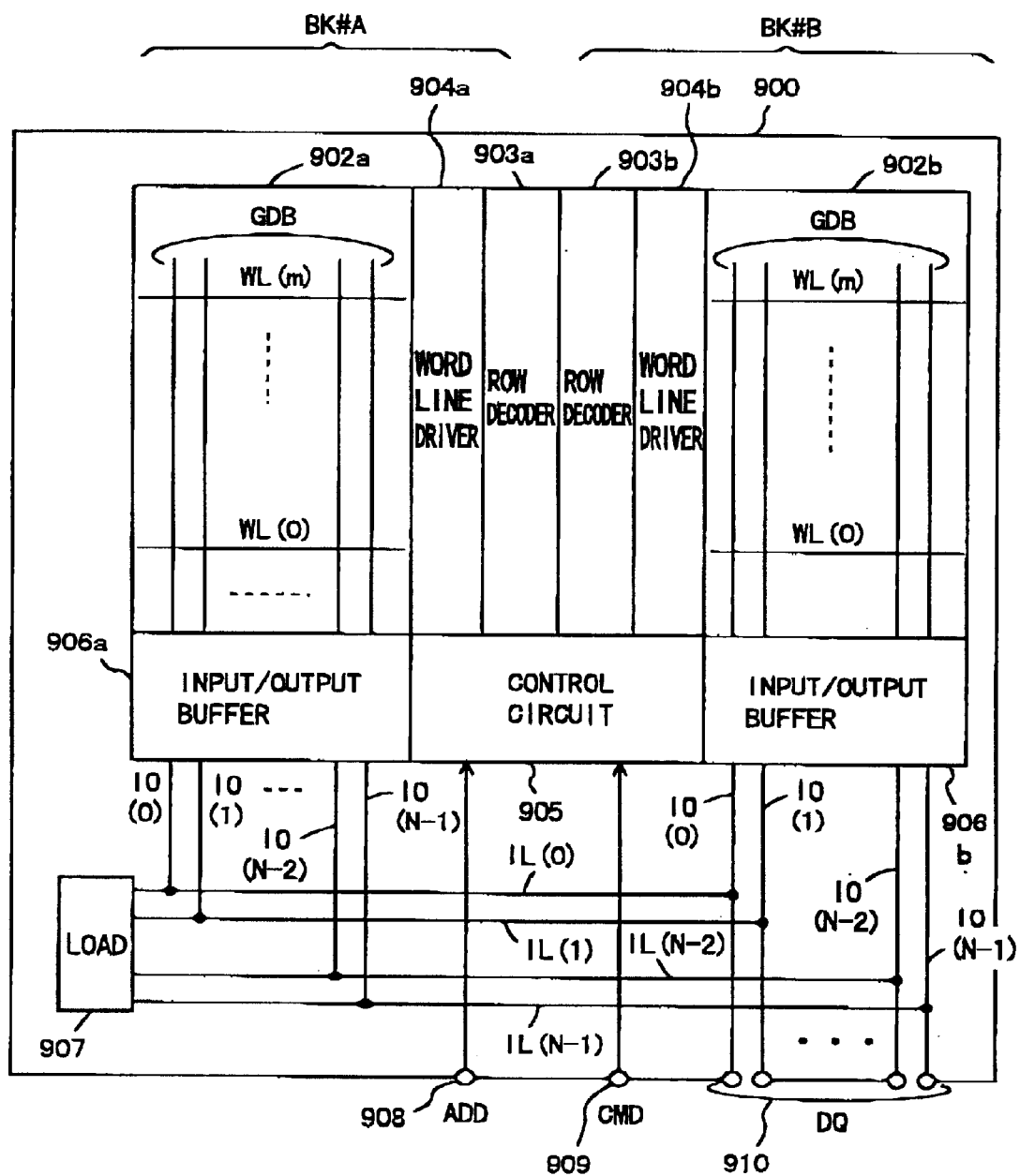
FIG. 25 is a schematic diagram showing an entire structure of a conventional semiconductor memory device.
Figure 26:
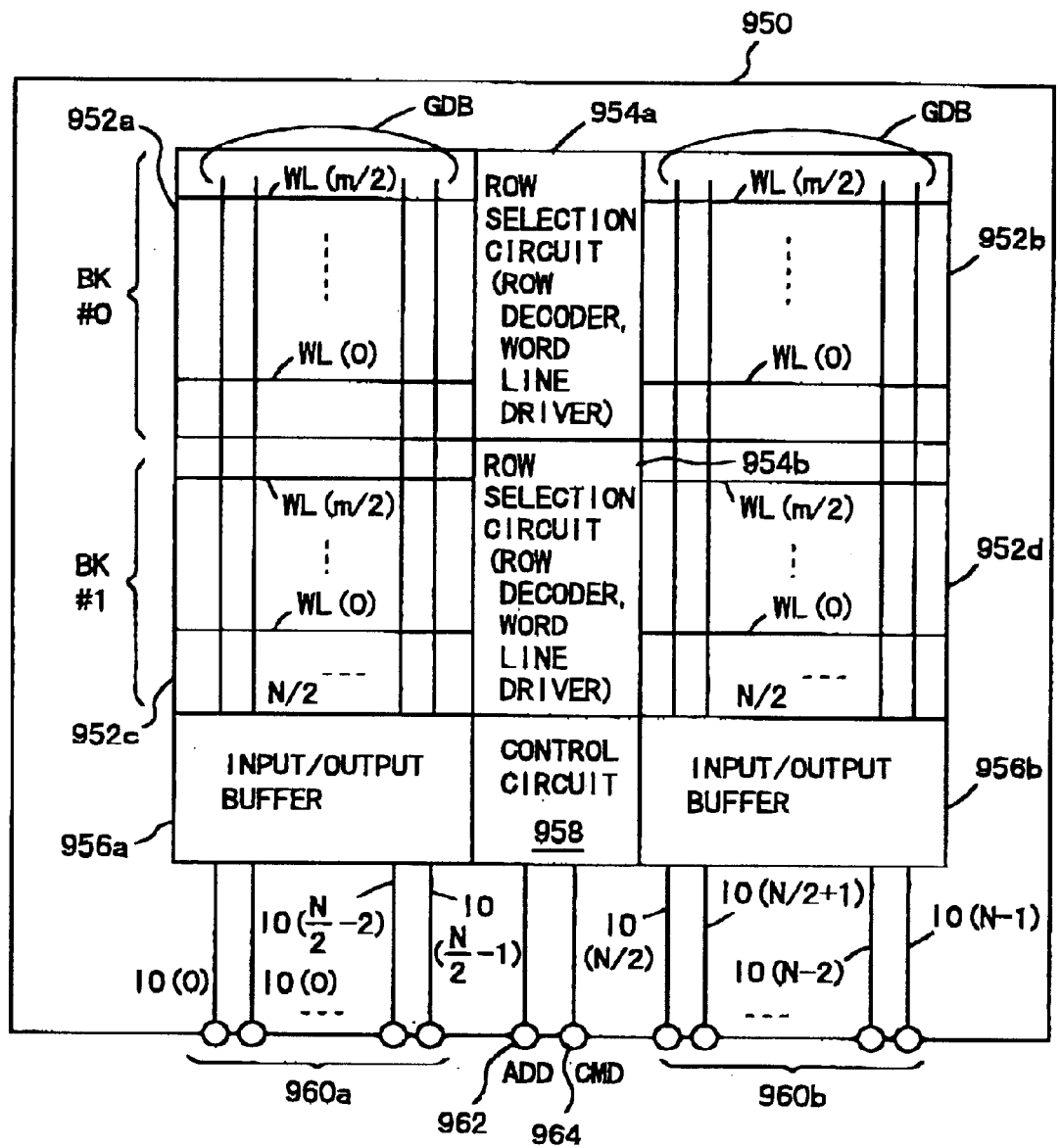
FIG. 26 is a schematic diagram showing another structure of the conventional semiconductor memory device.
Figure 27:
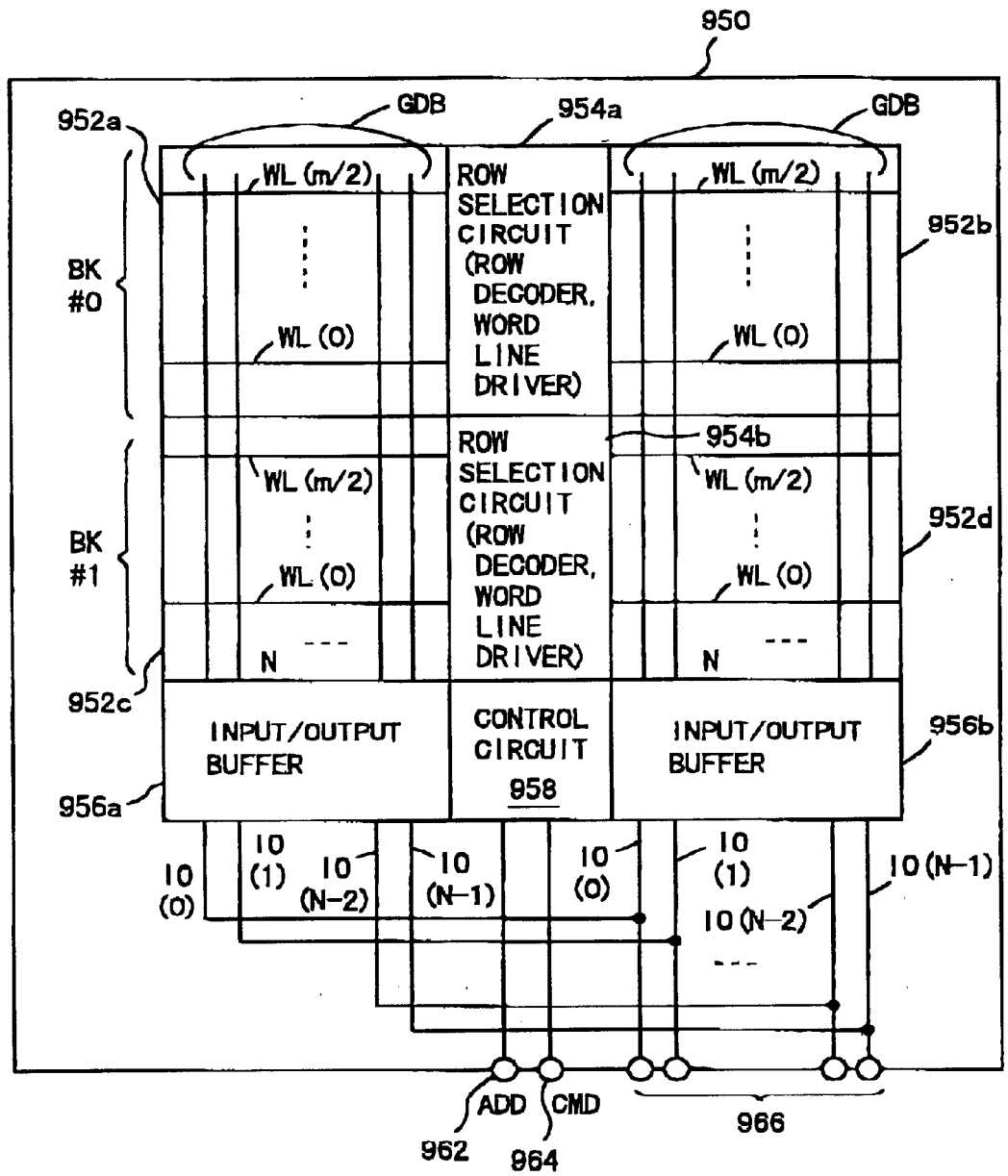
FIG. 27 is a schematic diagram showing an entire structure of a semiconductor memory device on which the present invention is based.

FIG. 24 schematically shows a structure of a modification of the IO selector. In FIG. 24, IO selection circuits 48l and 48r corresponding to IO selectors 7a and 7b are shown. IO selection circuit 48l includes a transfer gate 49al coupled to internal data line DBA <2i> and made conductive in response to IO line switch signal BUSSEL <0>, a transfer gate 49bl coupled to internal data line DBA <2i+1> and made conductive in response to IO line switch signal BUSSEL <1>, a transfer gate 49cl made conductive in response to IO line switch signal BUSSEL <2> to couple transfer gate 49al and 49bl, a transfer gate 49dl that is always conductive according to supply voltage VDD and couples data line IO <2i> to transfer gate 49cl and 49al, and a transfer gate 49el responsive to IO line switch signal BUSSEL <2> to become conductive complementarily to transfer ate 49cl and couple data line IO <2i> to transfer gates 49cl and 49bl.

IO selection circuit 48r included in IO selector 7b includes a transfer gate 49ar coupled to data line DB <2i> and made conductive in response to IO line selection signal BUSSEL <0>, a transfer gate 49bl coupled to data bus line DBB <2i+1> and made conductive in response to IO line switch signal BUSSEL <1>, a transfer gate 49cr to couple transfer gates 49ar and 49br in response to IO line switch signal BUSSEL <2>, a transfer gate 49dr responsive to IO line switch signal BUSSEL <2> to become conductive complementarily to transfer gate 49cr to couple data line IO <2i> to transfer gates 49ar and 49br, and a transfer gate 49er that is conductive all the time according to supply voltage VDD to couple data line IO <2i+1> to transfer gates 49cr and 49br.

In the normal page mode, transfer gates 49cl and 49cr are in ON state and transfer gates 49el and 49dr is in OFF state in IO selection circuits 48l and 48r. In the normal page mode, data line IO <2i> is coupled to transfer gates 49al and 49bl, and data line IO <2i+1> is coupled to transfer gates 49ar and 49br. One of data lines DBA <2i> and DBA <2i+1> is selected according to IO line switch signals BUSSEL <1:0>, and is coupled to data line IO <2i>. One of data lines DBB <2i> and DBB <2i+1> is coupled to data line IO <2i+1> according to IO line switch signals BUSSEL <1:0>. In this case, data bus DBA is coupled to even number data bus lines IO <2i>, and data bus DBB is coupled to odd number data bus lines <2i+1>. N-bit data transfer is implemented between the logic circuit and the DRAM macro without data collision.

In the half page mode, transfer gates 49cl and 49cr are in OFF state and transfer gates 49el and 49dr are in ON state. A memory sub array selected according to block selection signals IOBS <1:0> is coupled to N-bit data bus IO N−1:0>. The input/output circuits for a non-selected memory sub array are kept in the high-impedance state, and N-bit data can be correctly transferred to the selected memory sub array even when transfer gates are all in ON state except for short-circuited transfer gates 49d and 49cr in the IO selector.

In this case, data can be grouped into data on even number data lines and odd number data lines to be stored separately in the normal page mode.

The logic circuit can be adapted to supply mode setting signal MS to change the page size according to an operation mode. For example, if the size of a data block of a processing unit (16·16 pixels or 8·8 pixels, for example) is changed in application to image processing, a page size can be changed according to the size of an image region to be processed, so that efficient image data processing is accomplished with reduced overhead of page switching.

It is noted that in the structures shown in FIGS. 22 and 24, adjacent data bus lines outside the memory are coupled. However, if transfer gates 49c (49cl, 49cr) for short circuit are divided into higher-order bit group and lower-order bit group of data lines and corresponding data lines are coupled together, data of N/2 bits, as a unit, of higher order and lower order in N-bit internal data block can be sorted into data for higher order bits and data for lower order bits of the IO data bus IO outside the memory. In this case, the address bit for sorting N-bit data block into two blocks (higher order/lower order) can be merely utilized as column address signal ADD <j>. If odd number/even number column selection is performed, the column address bit corresponds to the least significant column address bit among column address bits designating N-bit columns.

The IO selector may be provided outside the DRAM macro. Connection of buses is merely required to be changed according to the page size. For example, if the DRAM macro is formed individually on a single chip, the IO selector may be provided outside the chip. If the IO selector is provided outside the DRAM macro, the layout area of the DRAM macro can be reduced. In this way, the chip area of DRAM that is used as one chip can be reduced.

Other Applications

The description above is made of an embedded DRAM integrated with a logic on a common semiconductor chip. However, the DRAM may be the one used as a single chip. The number of banks may be any, such as 4 or 8, not limited to 2.

The number of memory sub arrays is not limited to 2, and may be greater than 2. Just the number of data bits is increased accordingly and the IO selection structure remains unchanged. In this case, the block selection signal may be used for access operation (row or column selecting operation) for a plurality of memory sub arrays, one memory sub array, or the entire memory sub array at a time.

As heretofore described, according to the present invention, a low power consumption mode (half page mode) and a long page mode (normal page mode) can be coped with, merely utilizing the mode setting signal, without change in the internal circuit structure. A plurality of operation modes are implemented with one layout, which improves design efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory blocks, arranged in alignment in a row direction, each including word lines arranged extending in said row direction;
   a plurality of internal data buses provided for each respective memory block and arranged in a column direction perpendicular to said row direction;
   sub access circuits, provided corresponding to the respective memory blocks, each activated individually for selecting a word line and for making a data access to a memory cell in a corresponding memory block;
   control circuitry, provided commonly to said plurality of memory blocks, for controlling an access to the memory blocks in accordance with a mode selection signal instructing an operation mode, said control circuitry controlling the access on a memory block basis, in which memory blocks are activated independently from each other for selecting a word line and data access is made to a selected memory block in a first mode instructed by said mode selection signal, and controlling the access to the memory blocks commonly to the memory blocks in a second mode instructed by said mode selection signal, in which a word line is selected in each memory block at a time and data access is made to the memory blocks commonly;

a plurality of data nodes, arranged in a multi-bit width equal in width to each of the internal buses, coupled to a device outside of said semiconductor memory device; and a plurality of bus selection circuits provided corresponding to said plurality of internal data buses respectively, for changing a correspondence in connection between said plurality of data nodes and corresponding internal data buses according to said mode selection signal.

2. The semiconductor memory device according to claim 1, wherein said mode selection signal is externally supplied.

3. The semiconductor memory device according to claim 1, wherein said mode selection signal is internally generated fixedly.

4. The semiconductor memory device according to claim 1, further comprising a plurality of global data buses provided for each respective memory block, wherein said sub access circuits each includes buffer circuitry according to a data access block instruction signal, for transferring data between the global data buses and the internal data buses when designated by said data access block instruction signal.

5. The semiconductor memory device according to claim 1, wherein each of said bus selection circuits includes:

IO line switching signal generator responsive to an address signal and the mode selection signal, for generating a bus selection signal, and connection circuitry, including transfer gates provided for the bus lines of the corresponding internal data bus and responsive to the bus selection signal, for connecting the bus lines of the corresponding internal data bus to corresponding data nodes in one-to-one correspondence in a first mode, and connecting designated bus lines by the address signal to predetermined, corresponding data nodes in a second mode, the first mode and the second mode being designated by said mode selection signal.

6. The semiconductor memory device according to claim 1, wherein said plurality of data nodes are coupled to a logic formed on a common semiconductor chip with said semiconductor memory device.

7. The semiconductor memory device according to claim 1, wherein the bus selection circuits establish one-to-one connection between data lines of the internal data buses and the data nodes in said first mode and establish multiplicity-to-one connection between the data lines of the internal data buses and the data nodes in said second mode.

* * * * *